(12) United States Patent
Gong et al.

(10) Patent No.: US 10,629,800 B2
(45) Date of Patent: Apr. 21, 2020

(54) FLEXIBLE COMPACT NANOGENERATORS BASED ON MECHANORADICAL-FORMING POROUS POLYMER FILMS

(71) Applicant: Wisconsin Alumni Research Foundation, Madison, WI (US)

(72) Inventors: Shaoqin Gong, Middleton, WI (US); Qifeng Zheng, Madison, WI (US); Zhenqiang Ma, Middleton, WI (US); Yanfeng Tang, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 438 days.

(21) Appl. No.: 15/648,796

(22) Filed: Jul. 13, 2017

(65) Prior Publication Data

US 2018/0040806 A1 Feb. 8, 2018

Related U.S. Application Data

(60) Provisional application No. 62/371,319, filed on Aug. 5, 2016.

(51) Int. Cl.
*H01L 41/193* (2006.01)
*H02N 2/18* (2006.01)
(Continued)

(52) U.S. Cl.
CPC ............ *H01L 41/193* (2013.01); *C08J 5/24* (2013.01); *C08J 9/0061* (2013.01); *C08J 9/28* (2013.01); *C08J 9/365* (2013.01); *H01L 41/0477* (2013.01); *H01L 41/113* (2013.01); *H01L 41/45* (2013.01); *H02N 2/185* (2013.01); *H02N 2/186* (2013.01); *C08J 2201/0482* (2013.01); *C08J 2205/026* (2013.01); *C08J 2301/02* (2013.01); *C08J 2305/08* (2013.01);
(Continued)

(58) Field of Classification Search
CPC ........ H01L 41/113; H01L 41/193; H02N 2/18
See application file for complete search history.

(56) References Cited

U.S. PATENT DOCUMENTS 4,177,228 A 12/1979 Prölss
4,751,013 A 6/1988 Kaarmann
(Continued)

FOREIGN PATENT DOCUMENTS

WO WO2012/018890 2/2012

OTHER PUBLICATIONS

Alam, Md Mehebub, et al., Lead-free ZnSnO3/MWCNTs-based self-poled flexible hybrid nanogenerator for piezoelectric power generation, Nanotechnology 26, Apr. 1, 2015, pp. 165403.
(Continued)

*Primary Examiner* — J. San Martin
(74) *Attorney, Agent, or Firm* — Bell & Manninng, LLC; Michelle Manning

(57) ABSTRACT

Power generators that incorporate porous electric generation layers composed of mechanoradical-forming polymers are provided. Also provided are methods for using the generators to convert mechanical energy into and electrical signal to power electronic devices. The porous electric generation material includes an organic polymer that forms free radicals when covalent bonds are homolytically ruptured upon the application of a compressive force to the porous structure.

21 Claims, 38 Drawing Sheets

(51) Int. Cl.
*H01L 41/047* (2006.01)
*H01L 41/113* (2006.01)
*C08J 5/24* (2006.01)
*H01L 41/45* (2013.01)
*C08J 9/36* (2006.01)
*C08J 9/28* (2006.01)
*C08J 9/00* (2006.01)

(52) U.S. Cl.
CPC ........ *C08J 2383/04* (2013.01); *C08J 2425/06* (2013.01); *C08J 2427/06* (2013.01); *C08J 2427/18* (2013.01); *C08J 2429/04* (2013.01); *C08J 2433/06* (2013.01); *C08J 2459/00* (2013.01); *C08J 2483/04* (2013.01)

(56) References Cited

U.S. PATENT DOCUMENTS

| | | | |
|---|---|---|---|
| 5,841,493 | A | 11/1998 | Lipskier |
| 5,977,685 | A * | 11/1999 | Kurita .................... C08G 18/10 310/311 |
| 8,680,741 | B2 | 3/2014 | Kim et al. |
| 9,444,030 | B2 | 9/2016 | Wang |
| 2001/0023014 | A1 | 9/2001 | Patel |
| 2005/0018646 | A1 | 1/2005 | Hommura et al. |
| 2007/0205398 | A1 | 9/2007 | Smela |
| 2008/0168840 | A1 | 7/2008 | Seeley et al. |
| 2009/0121585 | A1* | 5/2009 | Lee ........................ H01M 4/131 310/319 |
| 2010/0208325 | A1 | 8/2010 | Piroux |
| 2010/0230629 | A1* | 9/2010 | Yu ......................... H01L 41/193 252/62.9 R |
| 2011/0021916 | A1 | 1/2011 | Morita |
| 2012/0029416 | A1 | 2/2012 | Parker |
| 2012/0068572 | A1 | 3/2012 | Jenninger et al. |
| 2012/0088994 | A1 | 4/2012 | Bode |
| 2012/0133247 | A1* | 5/2012 | Lee ......................... H01L 41/37 310/339 |
| 2013/0020909 | A1 | 1/2013 | Kim |
| 2013/0038299 | A1 | 2/2013 | Sohn et al. |
| 2013/0334930 | A1* | 12/2013 | Kang .................... H01L 41/113 310/339 |
| 2014/0084204 | A1* | 3/2014 | Tanimoto ................... C08J 5/18 252/62.9 R |
| 2014/0159547 | A1* | 6/2014 | Jun ........................ H02N 2/186 310/339 |
| 2014/0252915 | A1 | 9/2014 | Su et al. |
| 2015/0188028 | A1 | 7/2015 | Baik et al. |
| 2016/0145414 | A1* | 5/2016 | Capsal .................. C08F 214/22 310/330 |

OTHER PUBLICATIONS

Alam, Md. Mehebub, et al., Native Cellulose Microfiber-Based Hybrid Piezoelectric Generator for Mechanical Energy Harvesting Utility, ACS Appl. Mater. Interfaces 8 (3), Jan. 11, 2016, pp. 1555-1558.
Baytekin, B., et al., Retrieving and converting energy from polymers: deployable technologies and emerging concepts, Energy & Environmental Science 6, Aug. 19, 2013, pp. 3467-3482.
Baytekin, Bilge, et al., What Really Drives Chemical Reactions on Contact Charged Surfaces?, Journal of the American Chemical Society, Apr. 11, 2012, pp. 7223-7226.
Baytekin, H. Tarik, et al., Mechanoradicals Created in "Polymeric Sponges" Drive Reactions in Aqueous Media, Agnew. Chem. Int. Ed. 51, Mar. 1, 2012, pp. 3596-3600.
Baytekin, H. Tarik, et al., Supplementary Information for Mechanoradicals Created in "Polymeric Sponges" Drive Reactions in Aqueous Media, Angewandte Chemie 51:15, Mar. 1, 2012.
Cha et al., Porous PVDF as Effective Sonic Wave Driven Nanogenerators, Nano Lett. 11, Nov. 22, 2011, pp. 5142-5147.
Chang et al., Direct-Write Piezoelectric Polymeric Nanogenerator with High Energy Conversion Efficiency, Nano Lett. 10, Jan. 25, 2010, pp. 726-731.
Csoka, Levente, et al., Piezoelectric Effect of Cellulose Nanocrystals Thin Films, ACS Macro Letters 1, Jun. 25, 2012, pp. 867-870.
Gossweiler, Gregory R., et al., Mechanochemical Activation of Covalent Bonds in Polymers with Full and Repeatable Macroscopic Shape Recovery, ACS Macro Letters 3:3, Feb. 12, 2014, pp. 216-219.
Harrison et al., Piezoelectric Polymers, NASA/CR-2001-211422, ICASE Report No. 2001-43, Prepared for Langley Research Center under Contract NAS1-97046, Dec. 2001, pp. 1-26.
Harrison, J.S., et al., Piezoelectric Polymers, Encyclopedia of Polymer Science and Technology, Jul. 15, 2002, pp. 1-26.
He et al., Unzipped multiwalled carbon nanotubes-incorporated poly(vinylidene fluoride) nanocomposites with enhanced interface and piezoelectric beta phase, Journal of Colloid and Interface Science 393, Nov. 15, 2012, pp. 97-103.
Hsu, Tsung-Hsing, et al., Piezoelectric PDMS Electrets for MEMS Transducers, Micro Electro Mechanical Systems (MEMS), 2010 IEEE 23rd International Conference on Micro Electro Mechanical Systems (MEMS), Jan. 24, 2010.
J. Dodds, Development of Piezoelectric Zinc Oxide Nanoparticle-Poly(Vinylidene Fluoride) Nanocomposites for Sensing and Actuation, ProQuest Dissertations Publishing, 2013, pp. 153873.
Jana, Santanu, et al., The influence of hydrogen bonding on the dielectric constant and the piezoelectric energy harvesting performance of hydrated metal salt mediated PVDF films, Phys. Chem. Chem. Phys. 17 , Jun. 8, 2015, pp. 17429-17436.
Jeong, Chang Kyu, et al., Large-Area and Flexible Lead-Free Nanocomposite Generator Using Alkaline Niobate Particles and Metal Nanorod Filler, Advanced Functional Materials 24, Jan. 7, 2014, pp. 2620-2629.
Joung, Mi-Ri, et al., Piezoelectric nanogenerators synthesized using KNbO3 nanowires with various crystal structures, Journal of Materials Chemistry A 2, Sep. 9, 2014, pp. 18547-18553.
Kim, Heung Soo, et al., Electro-mechanical behavior and direct piezoelectricity of cellulose electro-active paper, Sensors and Actuators A 147, May 13, 2008, pp. 304-309.
Kim, Jaehwan, et al., Discovery of Cellulose as a Smart Material, Macromolecules 39, Apr. 11, 2006, pp. 4202-4206.
Lin, Zong-Hong, et al., BaTiO3 Nanotubes-Based Flexible and Transparent Nanogenerators, Journal of Physical Chemistry Letters 3, Nov. 21, 2012, pp. 3599-3604.
Mahadeva, Suresha K., et al., Piezoelectric Paper Fabricated via Nanostructured Barium Titanate Functionalization of Wood Cellulose Fibers, Applied Materials & Interfaces 6, Apr. 25, 2014, pp. 7547-7553.
Ramadan, Khaled S., et al., A review of piezoelectric polymers as functional materials for electromechanical transducers, Smart Materials and Structures 23:3, Jan. 17, 2014, pp. 033001.
Raymonda, J.W., et al., Electric Dipole Moment of SiO and GeO, The Journal of Chemical Physics 52, Apr. 1, 1970, pp. 3458-3461.
Shin, Sung-Ho, et al., Hemispherically Aggregated BaTiO3 Nanoparticle Composite Thin Film for High-Performance Flexible Piezoelectric Nanogenerator, ACS Nano 8:3, Feb. 11, 2014, pp. 2766-2773.
Tang et al., A new class of flexible nanogenerators consisting of porous aerogel films driven by mechanoradicals, Nano Energy 38, Jun. 10, 2017, pp. 401-411.
Turkevich, J., et al., The Dipole Moment of a Free Radical, Journal of the American Chemical Society 64:5, May 1942, pp. 1179-1180.
Wang, J.J., et al., Piezoelectric PDMS Films for Power MEMS, Solid-State Sensors, Actuators and Microsystems Conference (Transducers), 2011 16th International Solid-State Sensors, Actuators and Microsystems Conference, Jun. 5, 2011.
Werling, Keith A., et al., Piezoelectric Effects of Applied Electric Fields on Hydrogen-Bond Interactions: First-Principles Electronic Structure Investigation of Weak Electrostatic Interactions, The Journal of Physical Chemistry Letters 4, Apr. 7, 2013, pp. 1365-1370.
Wong et al., Macroporous polymers from particle-stabilized foams, J. Mater. Chem. 19, Jun. 25, 2009, pp. 5129-5133.

(56) References Cited

OTHER PUBLICATIONS

Wong et al., Piezoelectric Polymer Electrets from Particle-Stabilized Foams, published at http://akira.ethz.ch/~stweb/poster_pdf.php?id=23 , on or before Apr. 15, 2013.

Wong et al., PVDF Particle-stabilized Polymeric Foams as Piezoelectric Space-charge Electrets, 19th International Conference on Adaptive Structures and Technologies, Ascona, Switzerland, Oct. 6-9, 2008.

Yang, Chulho, et al., Piezoelectricity of wet drawn cellulose electroactive paper, Sensors and Actuators A: Physical 154, Jul. 25, 2009, pp. 117-122.

Zheng, Qifeng, et al., Cellulose Nanofibril/Reduced Graphene Oxide/Carbon Nanotube Hybrid Aerogels for Highly Flexible and All-Solid-State Supercapacitors, ACS Appl. Mater. Interfaces 7, 2015, pp. 3263-3271.

Zheng, Qifeng, et al., Green synthesis of polyvinyl alcohol (PVA)—cellulose nanofibril (CNF) hybrid aerogels and their use as superabsorbents, Journal of Materials Chemistry A 2, Dec. 16, 2013, pp. 3110-3118.

Zheng, Qifeng, et al., High-Performance Flexible Piezoelectric Nanogenerators Consisting of Porous Cellulose Nanofibril (CNF)/Poly(dimethylsiloxane) (PDMS) Aerogel Films , Nano Energy 26, Jun. 8, 2016, pp. 504-512.

Zheng, Qifeng, et al., Polyvinyl alcohol (PVA)—cellulose nanofibril (CNF)—multiwalled carbon nanotube (MWCNT) hybrid organic aerogels with superior mechanical properties, RSC Adv. 3, Aug. 27, 2013, pp. 20816-20823.

Zheng, Qifeng, et al., Supplementary Material for High-Performance Flexible Piezoelectric Nanogenerators Consisting of Porous Cellulose Nanofibril (CNF)/Poly(dimethylsiloxane) (PDMS) Aerogel Films , Nano Energy 26, Jun. 8, 2016.

Zhu, Guang, et al., Functional Electrical Stimulation by Nanogenerator with 58 V Output Voltage, Nano Letters 12, May 17, 2012, pp. 3086-3090.

\* cited by examiner

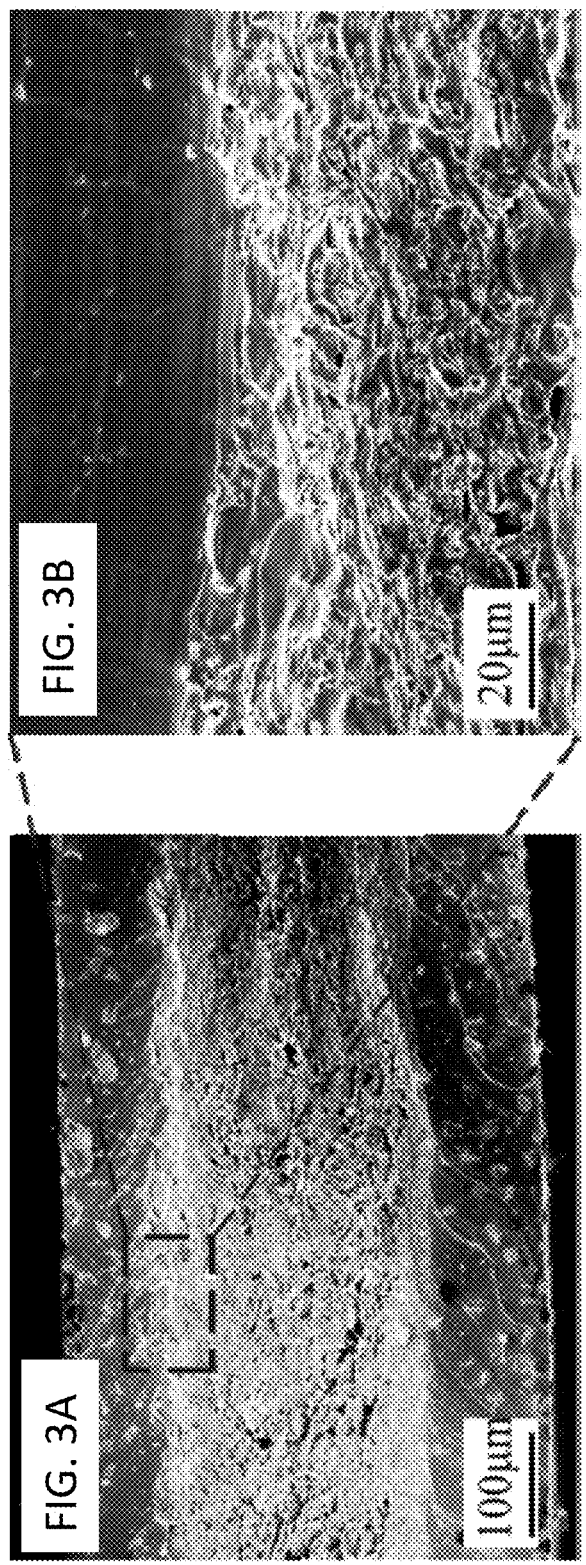

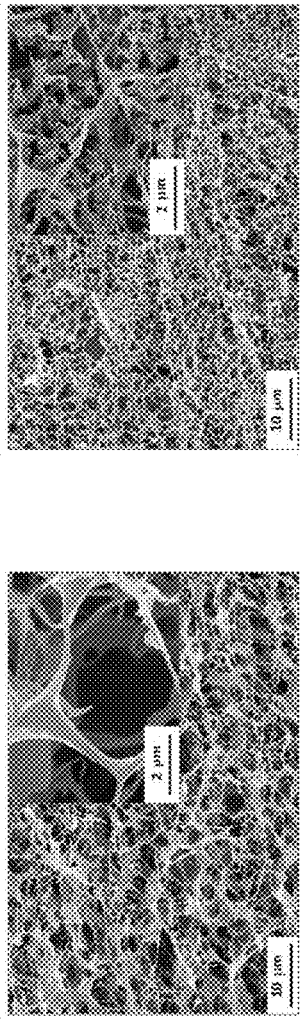
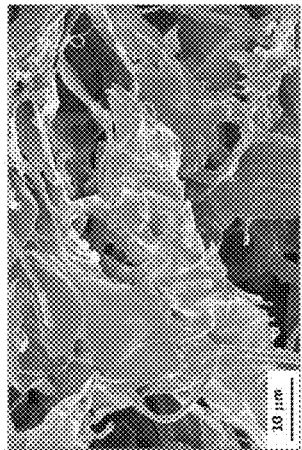
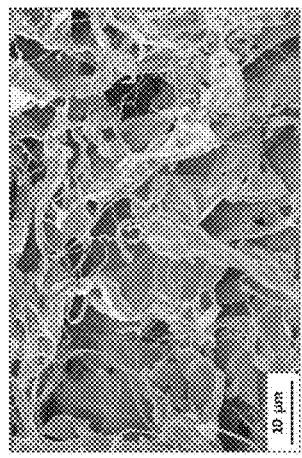
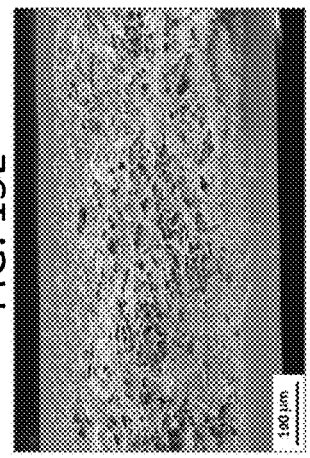
FIG. 15A
FIG. 15B
FIG. 15C
FIG. 15D
FIG. 15E

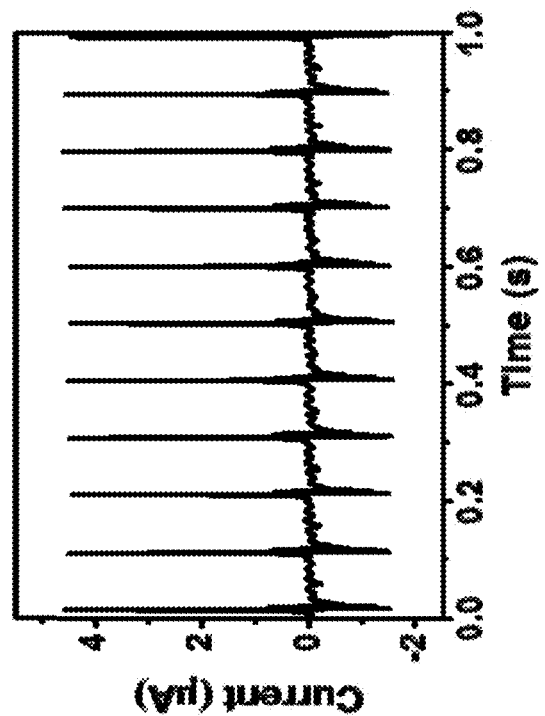
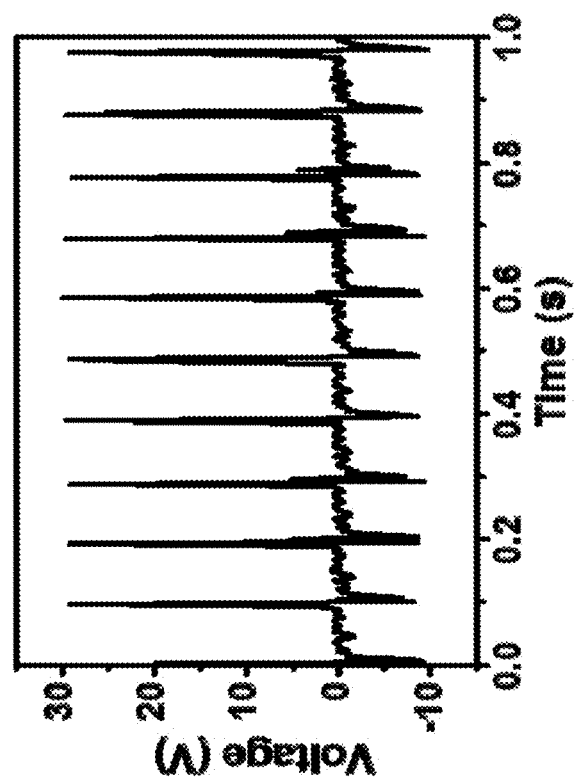
FIG. 16A

FLEXIBLE COMPACT NANOGENERATORS BASED ON MECHANORADICAL-FORMING POROUS POLYMER FILMS

CROSS-REFERENCE TO RELATED APPLICATIONS

The present application claims priority from U.S. provisional patent application No. 62/371,319, filed on Aug. 5, 2016, the entire contents of which are hereby incorporated by reference.

REFERENCE TO GOVERNMENT RIGHTS

This invention was made with government support under FA9550-09-1-0482 awarded by the USAF/AFOSR. The government has certain rights in the invention.

BACKGROUND

There is a growing demand for alternative renewable energy technologies due to the shortage of fossil energy resources and environmental concerns. Thus, various devices capable of harvesting energy from sustainable resources such as light, heat, and mechanical vibrations have been investigated. These include piezoelectric and triboelectric nanogenerators (NGs) that are capable of effectively harvesting ubiquitous mechanical energy from the natural environment and converting it to electric energy. For example, ZnO-nanowire-based NGs capable of converting mechanical energy to electrical power have been investigated. (See, for example, Xu et al., Nat Nano 5 (2010) 366-373; and Wang, et al., Science 312 (2006) 242-246.) The development of ZnO-nanowire-based NGs has reached an output power of sub-milliwatt levels, which is sufficient to power many small electronic devices. However, an electric poling step is essential for these traditional piezoelectric materials in order to align the electric dipoles to achieve high piezoelectric outputs. (See, X. Wang, Nano Energy 1 (2012) 13-24.) Furthermore, such NGs normally require sophisticated growth and fabrication procedures, thereby limiting their mechanical flexibility as well as their potential applications.

Triboelectric NGs, another technology for energy harvesting, can have higher output performance and lower cost relative to conventional piezoelectric NGs. The output power density of triboelectric NGs has been reported at the milliwatt per cm$^2$ level. However, existing triboelectric NGs require an airgap between contacting material pairs within the device assembly in order to induce a potential difference. The presence of the airgap not only requires a complicated fabrication and packaging process, but also leads to unfavorable durability and stability, which may limit the large-scale manufacturing of conventional triboelectric NGs for practical applications.

Various perovskite materials, including BaTiO$_3$ (BTO), Pb(Zr,Ti)O$_3$ (PZT), and (K, Na)NbO$_3$ (KNN) have also been utilized to enhance the output power generation of NGs.

NG flexibility is one of the key considerations in mechanical energy harvesting applications, and is often achieved by making a composite of an inorganic piezoelectric material and an elastomeric polymer. (See, for example, Lin et al., The Journal of Physical Chemistry Letters 3 (2012) 3599-3604; Jeong et al., Adv Funct Mater 24 (2014) 2620-2629; Joung et al., Journal of Materials Chemistry A 2 (2014) 18547-18553; and Park et al., Adv Mater 24 (2012) 2999-3004.) However, the inorganic piezoelectric materials in the polymer composites are prone to settling to the bottom of the composite layers, thereby significantly weakening the performance of the NGs.

SUMMARY

Flexible compact generators that incorporate porous active layers formed of mechanoradical-forming polymers are provided. Also provided are methods for using the flexible compact generators to convert mechanical energy into an electrical signal to power electronic devices.

One embodiment of a flexible compact generator comprises: a first deformable electrode; a second deformable electrode in electrical communication with the first deformable electrode; and a deformable porous layer of electric generation material disposed between the first deformable electrode and the second deformable electrode. The electric generation material comprises a porous support and a polymer coating on the surfaces of the porous support, including the surfaces of the pore walls. The polymer coating comprises an organic polymer that forms mechanoradicals upon the application of a compressive force.

Another embodiment of a flexible compact generator also comprises: a first deformable electrode; a second deformable electrode in electrical communication with the first deformable electrode; and a deformable porous layer of electric generation material disposed between the first deformable electrode and the second deformable electrode. In this embodiment, the electric generation material comprises a porous polymer matrix of an organic polymer that forms mechanoradicals upon the application of a compressive force.

One embodiment of an energy harvesting system comprises a flexible compact generator, as described herein, and an electronic device, wherein the generator and the electronic device are configured (that is—designed) such that the electronic device is powered by electrical energy generated by the generator when the generator is subjected to a periodic external compressive force.

One embodiment of a method of harvesting mechanical energy using an energy harvesting system, as described herein, comprises: exposing the generator to a periodic external compressive force, whereby the electric generation material converts the periodic external compressive force into electrical energy; and powering the electronic device with the electrical energy.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 3A is a cross-sectional SEM image of a porous CNF/(polydimethylsiloxane)PDMS film-based NG at a low magnification. FIG. 3(B) is a cross-sectional SEM image of a porous CNF/PDMS film-based NG at a high magnification.

FIG. 15A shows an SEM image of the bottom surface of the CMC aerogel. FIG. 15B depicts an SEM image of the bottom surface of the compressed CMC aerogel film. FIG. 15C shows a cross-section of the compressed CMC aerogel film. FIG. 15D depicts a cross-section of the PDMS-coated compressed CMC aerogel film (i.e., the porous CMC/PDMS aerogel film used to fabricate the NG). FIG. 15E shows a cross-section of the PDMS/(porous CMC/PDMS aerogel film)/PDMS tri-layer film. FIG. 15F shows an image of the flexible porous CMC/PDMS aerogel film.

FIG. 16A depicts the electric output ($V_{oc}$ and $I_{sc}$) measurement of the porous CMC/PDMS film-based compact NGs under a compressive stress of 0.05 MPa at a frequency of 10 Hz.

FIG. 17A shows output voltage and instantaneous power as a function of the load resistance. FIG. 17B shows the charging curve of a capacitor by a NG under a compressive stress of 0.05 MPa at a frequency of 30 Hz. FIG. 17C depicts a stability test for the NG at the first, second, and third day (1200 cycles per day).

FIG. 18A shows output voltage generated by a compact NG fabricated using a CMC aerogel film. FIG. 18B shows output voltage generated by a compact NG using a pure/solid PDMS film. FIG. 18C shows output voltage generated by a compact NG fabricated using a porous CMC/PDMS aerogel film. FIG. 18D shows output voltage generated by a compact NG fabricated using a pure PDMS/(porous CMC/PDMS aerogel film (40% porosity))/pure PDMS tri-layer film. FIG. 18E shows output voltage generated by a compact NG fabricated using a pure PDMS/(nearly solid CMC/PDMS aerogel film (8% porosity))/pure PDMS tri-layer film. FIG. 18F shows output voltage generated by a compact NG fabricated using a pure PDMS/(porous CMC/PDMS aerogel film (19% porosity))/pure PDMS tri-layer film.

FIG. 19A shows the output voltage of a solid PBA-PBMA film-based compact NG. FIG. 19B shows the output current of a solid PBA-PBMA film-based compact NG. FIG. 19C shows the output voltage of a porous CMC/PBA-PBMA aerogel film-based compact NG. FIG. 19D shows the output current of a porous CMC/PBA-PBMA aerogel film-based compact NG. These two types of NGs had approximately the same thickness of 530 µm.

FIG. 20A shows the output voltage of a porous CTS/PDMS aerogel film-based compact NG. FIG. 20B shows the output current of a porous CTS/PDMS aerogel film-based compact NG. FIG. 20C shows the output voltage of a porous PVA/PDMS aerogel film-based compact NG. FIG. 20D shows the output current of a porous PVA/PDMS aerogel film-based compact NG.

DETAILED DESCRIPTION

Figure 1:
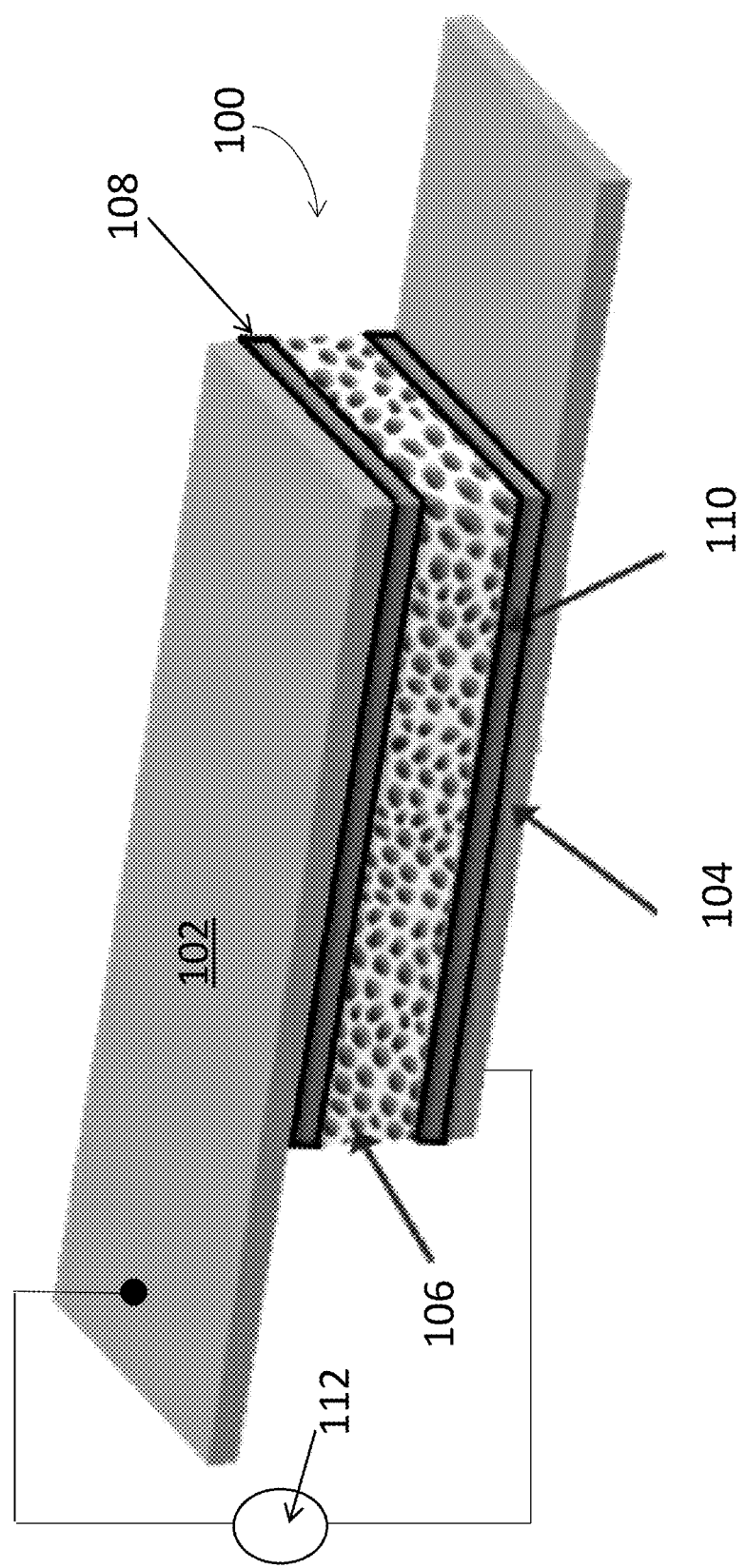
FIG. 1 is a schematic diagram of a flexible compact generator.

Flexible compact generators that incorporate porous active layers that include mechanoradical-forming polymers are provided. Also provided are energy harvesting systems and methods for using the flexible compact generators to convert mechanical energy into an electrical signal to power electronic devices. The flexible generators are able to produce stable, high output electric signals using relatively low cost, readily available and, in some cases, renewable and/or biocompatible materials. Because the flexible generators can be fabricated as small, lightweight, highly flexible, mechanically robust devices, they can be used in a variety of wearable-electronics applications and even inside biological systems.

The active layers of the flexible compact generators are composed of a porous electric generation material that generates an electric polarization in response to the application of a mechanical stress. The porous electric generation material comprises an organic polymer that creates free radicals when covalent bonds are homolytically ruptured upon the application of a compressive force to the porous structure. The resulting free radicals are referred to as mechanoradicals. In the present flexible compact generators, the mechanoradicals can lead to the formation of a large transient dipole. The electric dipole moment change resulting from the cleavage of the Si—O—Si bonds under mechanical stress creates an electric potential between the top and bottom electrodes, inducing the accumulation of negative and positive charges at the top and bottom electrodes. This can be used to drive a current flow through an external circuit, resulting in the generation of an output signal. The mechanoradicals can then react with chemical species present in the environment of the active layer to form polar groups that have permanent dipoles and/or that increase the density of electric dipoles in the active layer, thereby enhancing the active layer's piezoelectric response.

Because they generate an electric signal by a mechanoradical mechanism the present generators could be classified as a type of triboelectric generator. However, they are distinguishable from conventional triboelectric generators because they do not rely upon an airgap between dissimilar contacting materials in order to induce a potential difference across a pair of electrodes. Moreover, although some embodiments of the generators include inherently piezoelectric materials, the generators do not require the use of inherently piezoelectric materials to generate an electric signal. In fact, since an electric response is generated via mechanoradical formation, the electric generation layers can be made from polymers that have little or no intrinsic piezoelectric effect in their non-porous form. For the purposes of this disclosure, a polymer has intrinsic piezoelectric effect if the polymer in its solid, non-porous, bulk form has a molecular structure (e.g., a non-centrosymmetric crystalline structure) that provides its piezoelectric mechanism. In addition, because the electric response of the polymer structures is due, at least in part, to mechanoradical formation in the highly porous forms of the polymers, the present electric generation materials are distinguishable from piezoelectric composites that rely upon particles or interlayers of a piezoelectric material, such as an inorganic ceramic, dispersed in a polymer layer. Finally, because the electric generation materials do not require electrical poling or embedded bipolar charges stored in their cell walls, they are also distinguishable from ferroelectrets, which are polymer foams with internal voids having opposite charges embedded into their opposing cell wall surfaces via electrical poling.

An embodiment of a compact flexible generator is shown in the schematic diagram of FIG. 1. The generator 100 is a multilayered stack structure comprising a first electrode 102, a second electrode 104, and a porous, electric generation layer 106 disposed between first electrode 102 and second electrode 104. In the embodiment depicted here, the generator further includes a first reinforcing layer 108 disposed between first electrode 102 and electric generation layer 106 and a second reinforcing layer 110 disposed between second electrode 104 and electric generation layer 106. The optional reinforcing layers help to make the generator more robust under mechanical stress by distributing the compressive force more evenly over the electric generation layer. These layers are desirably made of a flexible, insulating material, which could provide high potential barriers thereby helping to trap the charge in the electric generation layer. Each of the layers in the generator is able to reversibly deform upon the application of a compressive force.

In some embodiments of the compact flexible generators, the porous electric generation layer comprises a porous support with a polymer coating on its surfaces, including the surfaces of walls of the internal pores. This polymer coating comprises the organic polymer that forms mechanoradicals upon the application of a compressive force. Other embodiments of the generators do not include a separate porous support for the mechanoradical-forming polymer. In these embodiments, the porous electric generation layer comprises a self-supporting porous polymer matrix of the organic polymer that forms mechanoradicals upon the application of a compressive force.

When the generators are subjected to an external compressive force, the electric generation layer is placed under a compressive strain and a strain-induced electric polarization results. The electric polarization creates a potential field between the first (e.g., top) electrode and the second (e.g., bottom) electrode. In order to eliminate the potential, positive and negative charges will accumulate at the top and bottom electrodes, thereby driving an electric current to flow through an external circuit. Once the external compressive stress is released, the diminishment of the potential leads to the back flow of the accumulated charges through the external circuit, reversing the electrical signal. Therefore, the application of a periodic compressive force results in the generation of an alternating output signal, which can be used to power an electric device 112 connected between the first and second electrodes. If desired, the output signal can be converted into a direct current (DC) by a rectification circuit. The electronic device may comprise, for example, a battery, a capacitor, a sensor, such as a motion or vibration sensor, a light-emitting device, such as a light-emitting diode (LED), or a combination of one or more thereof. The compressive force can occur at regular intervals or irregular intervals and may be generated by a wide variety of sources, including a person walking, running, or breathing, by the rotation of a tire, or the vibration of an engine.

In embodiments of the compact flexible generators that include a porous support, the porous support provides a matrix onto which a film of the mechanoradical-forming polymer is coated. In these embodiments, the porous support is an open porous structure of highly interconnected pores and the polymer film coats the surfaces of the matrix, including the interior surfaces that define the network of pores. However, the polymer material does not completely fill the pores and, therefore, the active layer remains porous even after the coating is applied. Substantially uniform and continuous coatings of the mechanoradical-forming polymer can be achieved via solution deposition, as described in the examples. However, the coating need not be uniform and continuous.

The porous supports and the porous electric generation layer fabricated from the supports desirably have high pore volumes (non-solid volumes) and small pore sizes, so that they have very high surface areas, which may enhance mechanoradical formation in the polymers. By way of illustration only, some embodiments of the porous electric generation layers have a porosity of at least 15%. This includes embodiments of the electric generation material that have a porosity of at least 20%, at least 30%, at least 40%, at least 60% and at least 70%. (Methods of measuring porosity are described in Example 3.) By way of illustration only, the electric generation material may have an average pore size of 10 μm or lower, including an average pore size of 5 μm or lower. Because the pores typically have irregular shapes, the size for a given pore can be defined as its longest diameter.

Aerogels, which have very high pore volumes and surface areas, are well suited for use as porous supports in the generators. An aerogel is an open-celled solid matrix that is composed of a network of interconnected nanostructures and that exhibits a porosity of at least 50 vol. % and, commonly, at least 90 vol. %. Aerogels can be derived from a gel by replacing the liquid component in the gel with a gas. The liquid can be extracted by, for example, supercritical drying, vacuum drying, or freeze-drying, as illustrated in the examples.

The porous support can, but need not be, made from a material that is inherently piezoelectric. However, a better output can generally be achieved by using a porous support that is composed of a piezoelectric material. Examples of piezoelectric materials from which the porous support can be made include various non-centrosymmetric polymers and ceramics.

Cellulose is an example of a material from which the porous support can be made. Cellulose is a natural polymer that is renewable, biocompatible, and biodegradable. It also exhibits both direct and converse piezoelectricity. Due to cellulose's relatively high piezoelectric coefficient (26-60 pC/N), excellent mechanical properties, and desirable flexibility, cellulose-based composites are well suited for energy harvesting applications. Moreover, due to cellulose's biocompatibility, cellulose-based piezoelectric generators may be used to harvest energy inside biological systems.

The cellulose may be an inherently piezoelectric form of cellulose (e.g., cellulose having a cellulose I crystal structure) and/or an aerogel-forming form of cellulose. Cellulose nanofibrils (CNFs) are an example of a cellulose material that is both piezoelectric and aerogel-forming. CNFs, which are derived from cellulose, have high surface areas and aspect ratios, and thus can easily form flexible aerogels with an entangled web-like porous structure. As used herein, the term CNF refers to long flexible fiber-like cellulose nanoparticles. CNFs can be branched or unbranched. CNFs comprise cellulose, hemicellulose, and, optionally, even lignin. The fiber-like cellulose particles are typically characterized by lengths in the range from about 100 to about 5,000 nm; widths in the range from about 5 to about 200 nm; and corresponding aspect ratios in the range from about 2 to about 1,000. CNFs are sometimes referred to as nanocellulose fibrils (NFC) or nanofibers.

Cellulose nanocrystals (CNCs), which have a higher degree of crystallinity than CNFs, are also piezoelectric and can be used as a porous support. Although, CNCs do not form aerogels by themselves, they can be combined with CNFs to form an aerogel-forming composite, as illustrated in Example 2. As used herein, the term CNC refers to elongated rod-like crystalline cellulose nanoparticles. CNCs comprise cellulose chains extracted from natural cellulosic materials by depolymerizing the amorphous cellulose using acid. CNCs can be in the form of single cellulose crystallite or a bundle of cellulose crystallites. "Cellulose crystallites" are described in Stamm A. J. 1964. *Wood and Cellulose Science*. New York: The Ronald Press Company. 549 p. CNCs are typically characterized by lengths in the range from about 60 to about 1000 nm; widths in the range from about 5 to about 50 nm; and corresponding aspect ratios in the range from about 1 to about 200. CNCs are sometimes referred to as nanocellulose crystals (NCCs), or cellulose nanowhiskers (CNW).

Carboxymethyl cellulose (CMC) is another example of a cellulose-based material that can provide a porous support. CMCs are amorphous polymers that form aerogels, but are not intrinsically piezoelectric materials.

Other examples of materials from which the porous supports can be made include: organic polymers, including organic polymer aerogels; polysaccharides, including polysaccharide aerogels; and inorganic ceramics, including ceramic aerogels. Poly(vinyl alcohol) (PVA) and polyacrylamide are examples of suitable organic polymers. Chitins and chitosans are examples of suitable piezoelectric, aerogel-forming materials. Aluminum oxide ($Al_2O_3$) and silica are examples of suitable aerogel-forming inorganic ceramics.

For embodiments of the electric generation layer that do not include a porous support, a self-supporting, porous matrix of the mechanoradical-forming polymer can be made by other known methods. For example, the materials can be made by dispersing solid particles in a solution comprising the polymer; forming the solution into a layer and drying the layer to form a film comprising a non-porous matrix of the organic polymer with the solid particles dispersed in the matrix; and removing the particles from the matrix to form a porous matrix of the polymer having interconnected pores. Such methods are described in U.S. patent application publication number 2014/0333184; Lee et al., Adv Mater 26 (2014) 5037-5042; and Mao et al., Adv Energy Mater 4 (2014) 1301624.

The mechanoradical-forming organic polymers provide the generators with an enhanced response relative to generators having the same structure and dimensions (e.g., layer thicknesses) and comprising the same materials, with the exception that that electric generation layer comprises a non-porous layer of the organic polymer or comprises only the support material without the mechanoradical-forming polymer coating. The enhanced electric response can be observed as a higher output voltage, where the output voltage for the generator can be measured as described in Example 1. For the purposes of comparing the output voltage of generators having electric generation layers composed of different materials, the output voltage can be measured using a periodic compression pressure of 0.05 MPa with a frequency of 10 Hz. By way of illustration, some embodiments of the generators comprise a porous layer of a mechanoradical-forming polymer have an output voltage that is at least twice as large as the output voltage of a generator having the same structure and dimensions and comprising the same materials, except that the electric generation layer comprises either a non-porous layer of the polymer or the porous support without the mechanoradical-forming polymer film. This includes embodiments of the generators that produce an output voltage that is at least five times as large, at least seven times as large, or at least 10 times as large as the output voltage produced by a generator having the same structure and dimensions and comprising the same materials, except that the electric generation layer comprises either a non-porous layer of the polymer or the porous support without the mechanoradical-forming polymer film.

In some embodiments of the generators, the porous mechanoradical-forming polymer is not intrinsically piezoelectric (or is only very weakly piezoelectric) in its non-porous, bulk form and forms very few, if any, mechanoradicals upon compression in its non-porous, bulk form. Polydimethylsiloxane (PDMS) is one example of such a polymer. As demonstrated in Example 1, a generator having an electric generation layer comprising a non-porous layer of pure PDMS produces an insignificant output signal under a periodic mechanical compression. However, when that active layer is replaced by an active layer comprising a supported porous matrix of PDMS, the output signal produced by the periodic mechanical compression increases dramatically. The output signal can be further enhanced by the use of reinforcing layers (e.g., pure PDMS layers) between the electrodes and the active layer. This result can be explained by the ability of PDMS, in its porous form, to generate Si—O. and Si. mechanoradicals under a compressive stress, as described in Example 1 and shown in FIG. 9.

Other polymers that form mechanoradicals when provided in a porous form include poly(n-butyl acrylate) (PBA), poly(n-butyl methylacrylate) (PBMA), poly(vinyl chloride), polytetrafluoroethylene, polyoxymethylene, and polystyrene. Like, PDMS, these polymers are not intrinsically piezoelectric, but are able to provide a piezoelectric output when provided in a highly porous form. In some embodiments of the generators, two or more of these (or other mechanoradical-forming) polymers can be blended together to provide a coating or a porous support with the desired mechanical properties (e.g., flexibility).

Unless otherwise indicated, any measured or measurable values cited in this disclosure refer to those values at room temperature (23° C.) and pressure.

EXAMPLES

Example 1

This example illustrates the structure and fabrication process of high-performance flexible NGs employing highly flexible porous CNF/PDMS aerogel films. The porous CNF/PDMS aerogel film was fabricated by coating a layer of PDMS on the compressed porous CNF aerogel film produced by an environmentally friendly freeze-drying process. The porous CNF/PDMS aerogel film was then sandwiched between two thin PDMS reinforcing films, followed by two aluminum foils, to form the NGs. Under periodic external mechanical deformation by an oscillator at a frequency of 10 Hz, the resulting flexible porous CNF/PDMS film-based NGs (1 cm×2 cm×480 μm) exhibited very stable and high output electric signals; namely, an open-circuit voltage ($V_{oc}$) of 60.2 V, a short-circuit current ($I_{sc}$) of 10.1 μA, and a corresponding power density of 6.3 mW/cm$^3$. The electric power generated by these NGs was able to directly turn on 19 blue LEDs and charge up a capacitor up to 3.7 V. Therefore, this example illustrates a simple, cost-efficient, and scalable method for fabricating highly flexible and high performance NGs based on an abundant natural polymer (i.e., CNFs) and PDMS, both of which are biocompatible.

Experimental Section

Preparation of Cellulose Nanofibrils (CNFs)

A commercially supplied, fully bleached *eucalyptus* Kraft pulp was used to prepare the CNFs by TEMPO-oxidation. The detailed procedure was reported previously by our group. (See, Zheng et al., ACS Appl Mater Inter 7 (2015) 3263-3271; and Zheng et al., Journal of Materials Chemistry A 2 (2014) 3110-3118.) The resulting CNF suspension with a concentration of 0.85% was stored at 4° C. without any treatment before future utilization.

Preparation of CNF Aerogel

A CNF solution (20 mL) in aluminum pans was frozen in a dry ice-acetone solution at −78° C. The CNF aerogel was obtained by a freeze-drying process as previously reported. (See, Zheng et al., RSC Advances 3 (2013) 20816-20823; and Zheng et al., Journal of Materials Chemistry A 2 (2014) 3110-3118.)

Preparation of Porous CNF/PDMS Films

A diluted PDMS solution was prepared by mixing a PDMS prepolymer, curing agent (Sylgard 184, DowCorning), and ethyl acetate in the ratio of 10:1:20. The CNF aerogels were first compressed into aerogel films under a pressure of 0.5 MPa and then were coated with the PDMS solution using a vacuum-assisted liquid filling method. (See, T. Zhai, et al., Acs Appl Mater Inter 7 (2015) 7436-7444.) Next, the PDMS-coated compressed CNF aerogel films were left in a fume hood at room temperature for about 2 h to vaporize the ethyl acetate followed by curing at 100° C. for 1 h. The thickness of the porous CNF/PDMS films was approximately 280 μm.

Fabrication of Electric Nanogenerators (NGs)

First, to make the porous CNF/PDMS aerogel film more robust under mechanical stress or deformation, a thin solid PDMS layer (~100 μm) was spin-coated on both sides of the aerogel film. The PDMS solution used here was made by mixing a PDMS prepolymer and curing agent at a ratio of 10:1, without any organic solvent. To fabricate the porous CNF/PDMS aerogel film-based NG having a five-layer structure (i.e., Al/PDMS/(porous CNF/PDMS aerogel film)/PDMS/Al), the sandwich-like PDMS/(porous CNF/PDMS aerogel film)/PDMS composite film was first cut into 1 cm×2 cm pieces. Thereafter, both sides of the PDMS/(porous CNF/PDMS aerogel film)/PDMS composite film were taped with aluminum foils as electrodes. For comparison purposes, three other types of NGs—(1) a NG comprised of a pure PDMS layer and two aluminum electrodes, (2) a NG comprised of a CNF aerogel film and two aluminum electrodes; and (3) a NG comprised of a porous CNF/PDMS aerogel film and two aluminum electrodes—were also fabricated with the same dimensions.

Characterization and Electrical Measurement

The microstructure of the CNF aerogels and porous CNF/PDMS aerogel films were studied using a scanning electron microscope (SEM, LEO GEMINI 1530). The SEM samples were treated using gold sputtering. The FTIR spectra were recorded on a Tensor 27 spectrometer (Bruker, USA) with 4 cm$^{-1}$ resolution at room temperature. Thermal stability measurements were carried out using a thermogravimetric analyzer (TGA, Q50 TA Instruments, USA) from 30 to 800° C. at a 10° C./min heating rate under N2 protection. X-ray diffraction (XRD) patterns were carried out on a D8-Discovery diffractometer (Bruker, USA) with Cu-Kα radiation at a scanning rate of 5°/min. Compression testing was conducted using a rheometer (AR 2000ex, TA Instruments, USA) at a constant compression rate of 2 μm/s. The NG was mechanically triggered by an oscillator (LDS V201, Brüel & Kjær, Denmark) that provided dynamic impact with controlled force and frequency. The electrical output signals of the NGs were recorded using an oscilloscope (DS1102E, Rigol, China) and a potentiostat (versaS-TAT-3, Princeton Applied Research, USA).

Results and Discussion

Figure 2B:
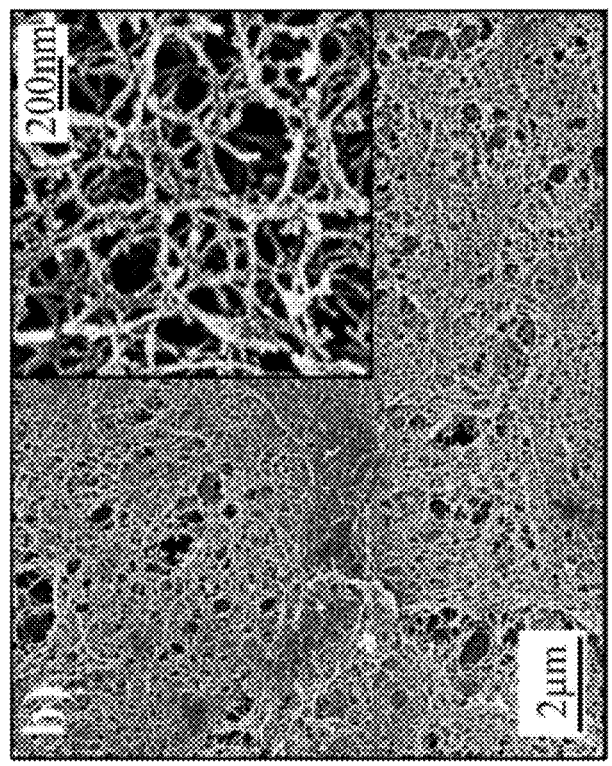
FIG. 2B is an SEM image of the compressed CNF aerogel film.
Figure 2A:
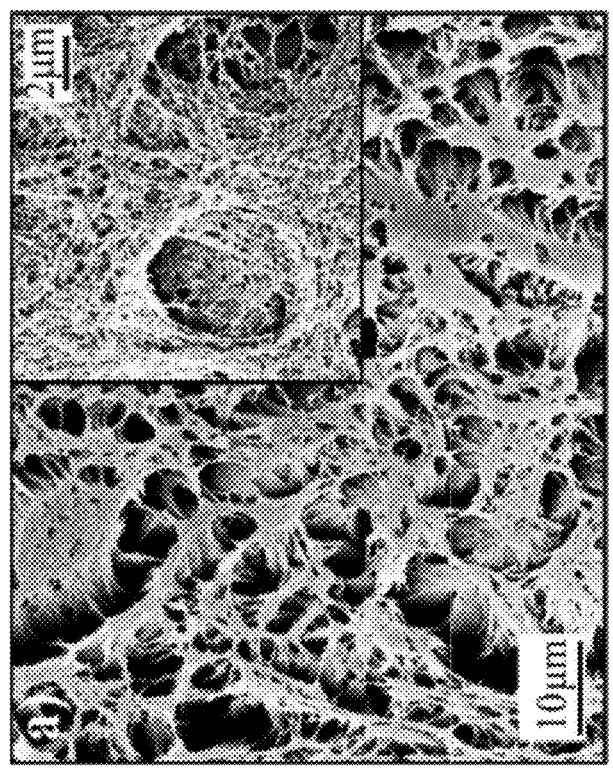
FIG. 2A is a scanning electron microscope (SEM) image of the bottom surface of an as-fabricated cellulose nanofibril (CNF) aerogel.
Figure 7A:
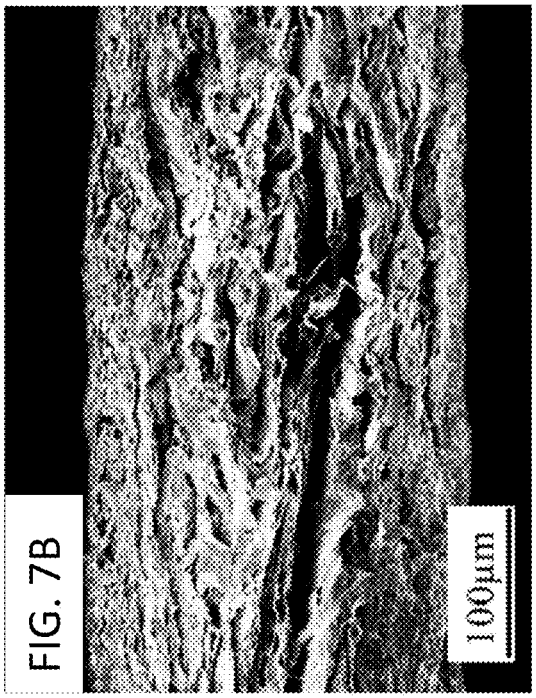
FIG. 7A is an SEM image of the cross-section of a compressed CNF aerogel film.
Figure 7B:
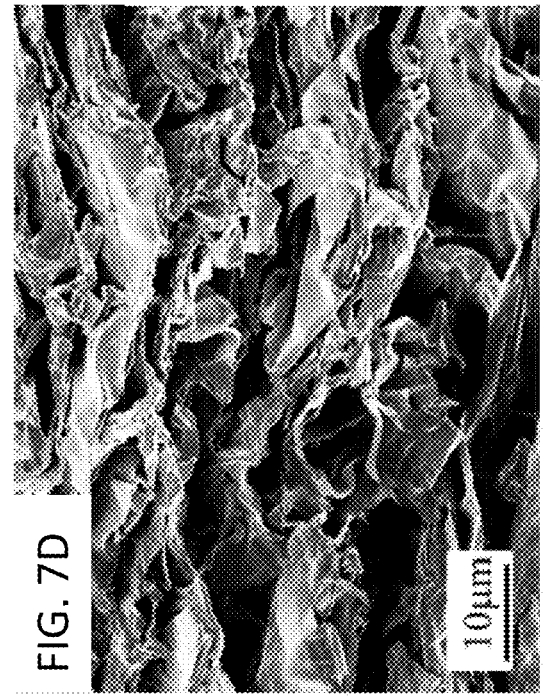
FIG. 7(B) is an SEM image of the cross-section of the compressed CNF aerogel film coated with PDMS.
Figure 7C:
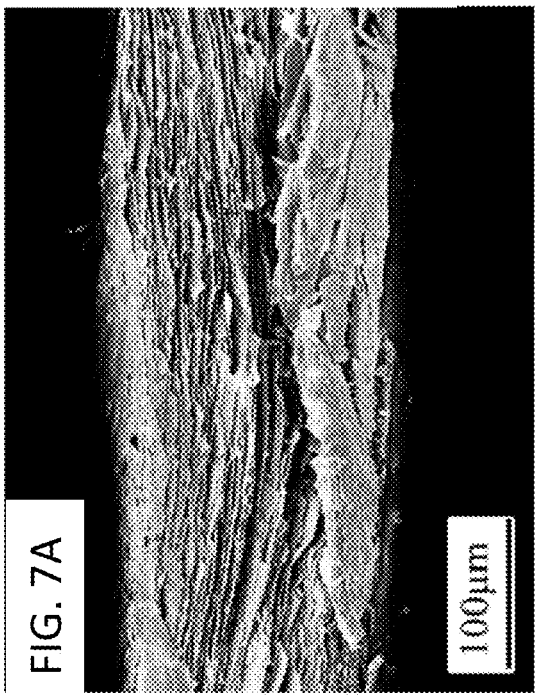
FIG. 7C is a higher magnification SEM image of the cross-section of the compressed CNF aerogel film.
Figure 7D:
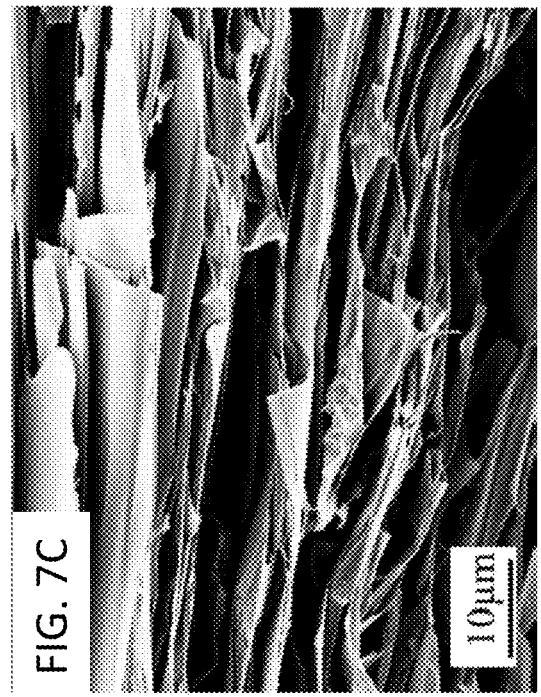
FIG. 7D is a higher magnification SEM image of the cross-section of the compressed CNF aerogel film coated with PDMS.

To form the porous CNF/PDMS aerogel film used as the core layer of the NGs, the CNF aerogel produced by the environmentally friendly freeze-drying process was first compressed and then coated with a layer of PDMS that completely covered the porous aerogel surface. The as-fabricated CNF aerogel had an ultralight density of 8.5 mg/mL. FIG. 2A shows the microstructure of the bottom surface of the as-fabricated CNF aerogel. The CNF aerogel exhibited an interconnected, highly porous, and nanofiber-like structure. (See, A. Javadi, et al., Acs Appl Mater Inter 5 (2013) 5969-5975; and Q. Zheng, Z. Cai, Z. Ma, S. Gong, Acs Appl Mater Inter 7 (2015) 3263-3271.) By compressing the CNF aerogel at 0.5 MPa, a CNF aerogel film with a uniform thickness of ~200 μm was obtained. The highly porous microstructure of the CNF aerogel was largely preserved in the compressed CNF aerogel film (FIG. 2B), although the pore diameter decreased to the nanoscale. The highly porous compressed CNF aerogel film with nanosized pores can greatly facilitate the absorption of the PDMS prepolymer/ethyl acetate solution, thereby leading to a complete PDMS coating on the porous surface of the CNF aerogel. FIGS. 7A-7D show cross-sectional SEM images of the compressed CNF aerogel film before and after PDMS coating. The compressed CNF aerogel film exhibited a well-stacked layer structure before PDMS coating as shown in FIG. 7A and FIG. 7C. FIG. 7B and FIG. 7D demonstrate that the aerogel surface was fully coated with PDMS. In addition, the PDMS coating caused a slight swelling of the compressed CNF aerogel film (e.g., from 200 to 280 μm).

Figure 2C:
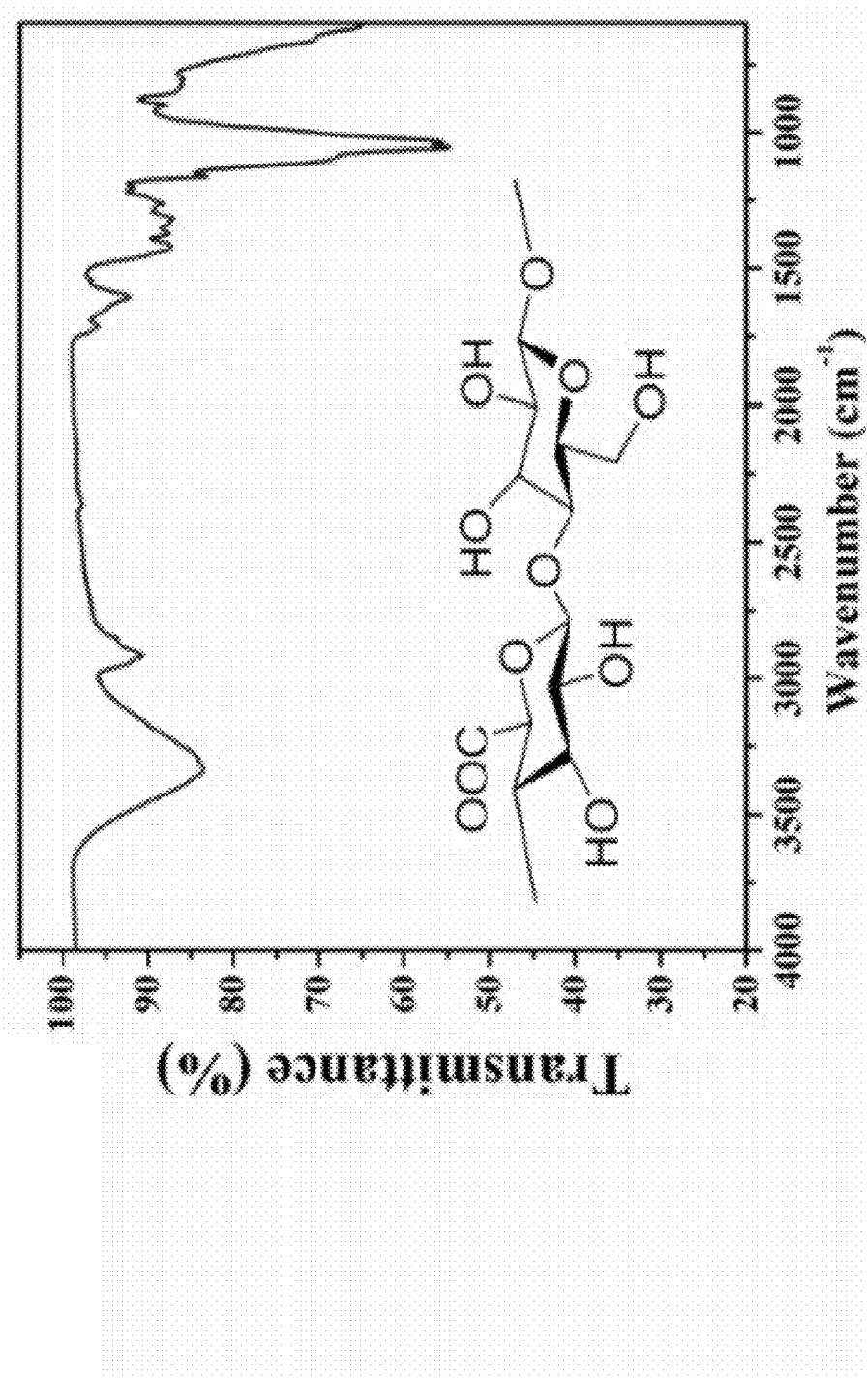
FIG. 2C is an SEM image of the Fourier transform infrared (FTIR) spectra of the compressed CNF aerogel.
Figure 2D:
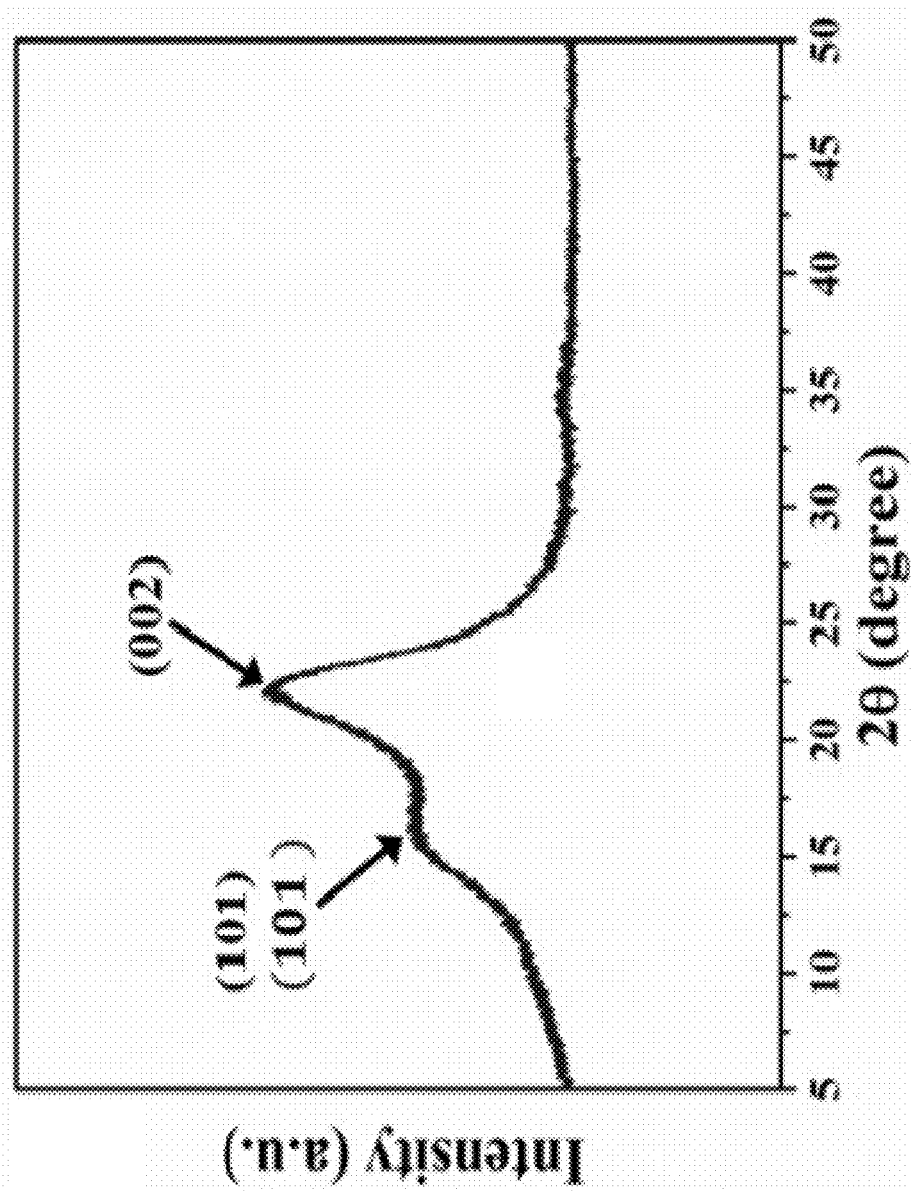
FIG. 2D is an SEM image of the x-ray diffraction (XRD) pattern of the compressed CNF aerogel. Note that the nanoparticles attached to the surfaces of the CNFs shown in the inset of FIG. 2B were gold nanoparticles that were generated during the gold sputtering treatment of the SEM sample.

Cellulose is a polysaccharide that consists of β-1, 4-D-linked glucose chains, in which the glucose units are joined by single oxygen atoms (acetal linkages) between the C-1 of one glucose unit and the C-4 of the next unit. (See, D. Klemm, et al., Angewandte Chemie International Edition 44 (2005) 3358-3393.) As shown in the inset of FIG. 2C, there are an abundant number of hydroxyl groups on the glucose unit that can easily form hydrogen bonds with each other to hold the chain together. As shown in the FTIR spectrum of the CNF aerogel (FIG. 2C), the peak of the characteristic absorption band of O—H stretching vibration was broadened and down-shifted to ~3343 cm$^{-1}$, which was attributed to the formation of hydrogen bonds. (See, F. C. Wang, et al., Journal of Polymer Science Part B: Polymer Physics 32 (1994) 1305-1313.) FIG. 2D shows the X-ray diffraction (XRD) patterns of the CNF aerogel. The XRD pattern of the CNF aerogel exhibited a distinct peak at 2θ=22.2°, corresponding to the (002) lattice planes of cellulose I. Moreover, there are two overlapping peaks at 2θ=14.0°-17.8°, corresponding to the (101) and (10$\bar{1}$) lattice planes of the cellulose I crystalline structure. (See, Q. Zheng, et al., Acs Appl Mater Inter 7 (2015) 3263-3271; and Y. Okita, et al., Biomacromolecules 11 (2010) 1696-1700.) The degree of CNF crystallinity, calculated from a Gaussian fitting of the XRD curve (Equation 1), was 55%. (See, C. J. Garvey, et al., Macromol Chem Phys 206 (2005) 1568-1575.) Under an external stress, the displacement or reorientation of the electric dipoles in the cellulose I crystal lattice takes place, which will lead to the generation of electricity.

The degree of crystallinity of CNFs ($\chi_c$) was calculated from Gaussian fitting of the XRD curve by using the following equation, [17]

$$\chi_c = \frac{\Sigma A_c}{\Sigma A_c + \Sigma A_a}, \tag{1}$$

where $\Sigma A_c$ and $\Sigma A_a$ are the total integral area of the crystalline peaks and amorphous halos, respectively.

Figure 8:
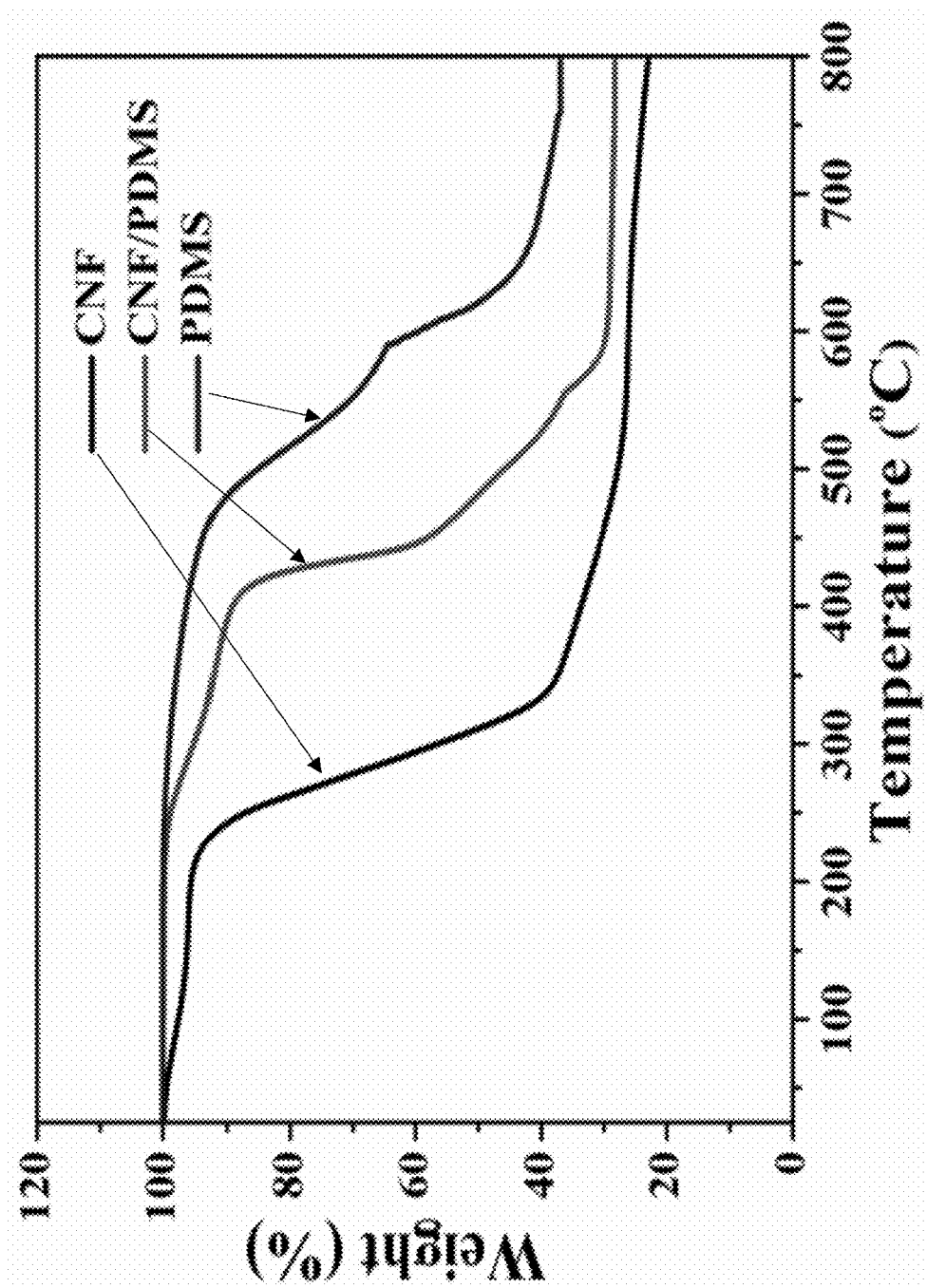
FIG. 8 shows thermogravimetric analysis (TGA) curves of the compressed CNF aerogel film, a pure PDMS film, and a porous CNF/PDMS film.

The thermal stability of piezoelectric materials can significantly affect their performance and potential applications. The thermal stabilities of the CNF aerogel, porous CNF/PDMS film, and pure PDMS film were investigated using a thermogravimetric analyzer (TGA) in a N$_2$ atmosphere as shown in FIG. 8. The CNF aerogel was thermally stable up to 225° C. Moreover, the thermal stability of the CNF aerogel was largely improved after PDMS coating. For example, the temperatures corresponding to a 10% weight loss were 242 and 410° C., for the CNF aerogel and CNF/PDMS aerogel films, respectively. As shown in FIG. 8, the porous CNF/PDMS aerogel film showed two weight loss processes. The weight loss occurring in the temperature range of 225 to 426° C. corresponded to the decomposition of CNFs in the CNF/PDMS aerogel film. The weight loss occurring in the temperature range of 426 to 600° C. was attributed to the decomposition of PDMS in the CNF/PDMS film in reference to pure PDMS.

The power density of as-fabricated NG was calculated using the following equation:

$$\text{Power density} = \frac{\text{Power}}{\text{Area} \times \text{Thickness}} = 6.3 \text{ mW/cm}^3. \tag{2}$$

Here, V=60.2 V, I=10.1 μA, area=1×2 cm$^2$, and thickness=480 μm=0.048 cm.

The CNF/PDMS aerogel films, used to fabricate the NGs, were mechanically robust and highly flexible. The electric NG devices consisted of five layers, as schematically shown in FIG. 1. The porous CNF/PDMS aerogel film serves as the source of the electric generation under an external stress. The two pure PDMS thin layers (~100 μm), spin-casted on both sides of the CNF/PDMS aerogel film, were used to further enhance the mechanical robustness of the CNF/PDMS aerogel film under extreme mechanical stress or deformation as well as the performance of the resulting NGs. The aluminum foils were used as the top and bottom electrodes in the NG devices. FIG. 3A shows the cross-sectional SEM image of the PDMS/(porous CNF/PDMS aerogel film)/PDMS composite film clearly exhibiting a tri-layer structure. As shown in the high magnification SEM image (FIG. 3B), no separation between the CNF/PDMS film and the pure PDMS layer was observed owing to the inherent stickiness of PDMS.

Figure 4A:
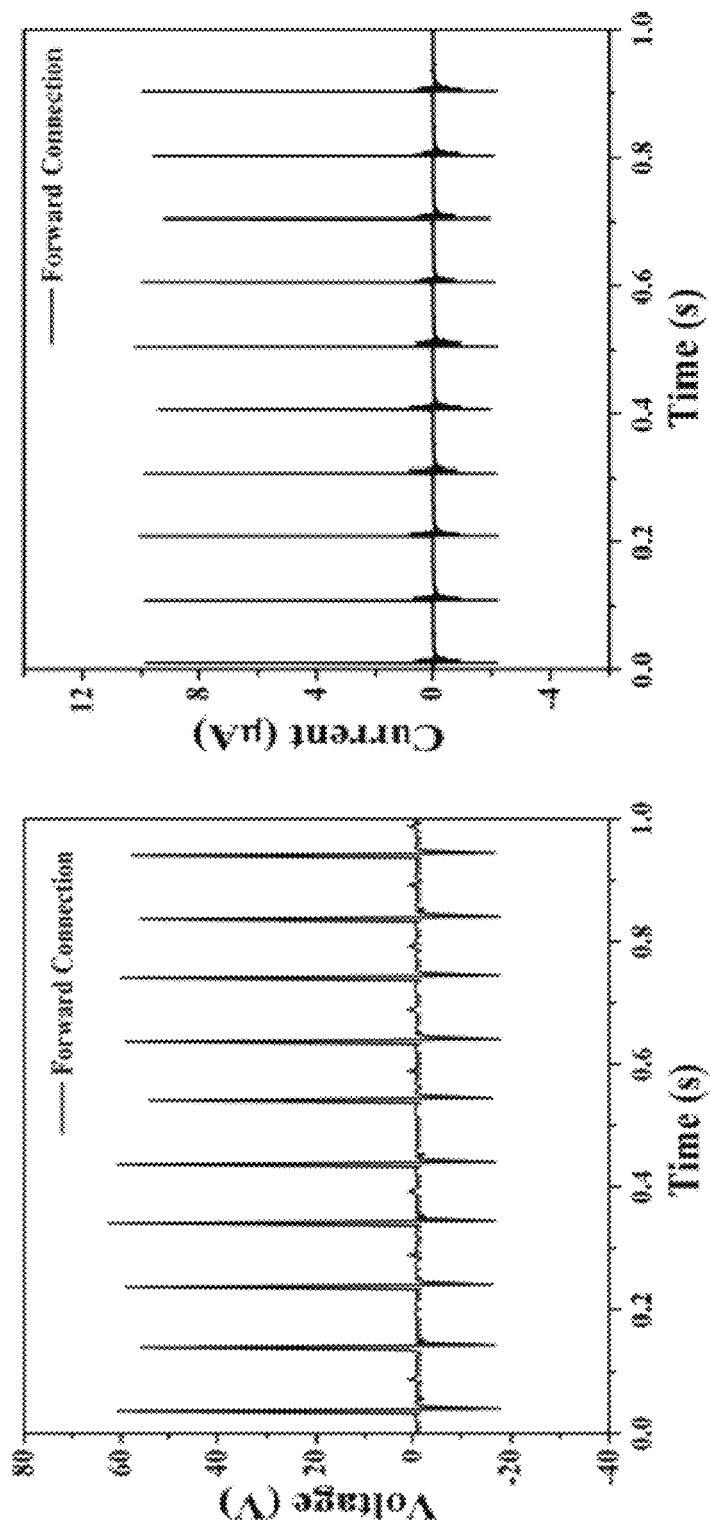
FIG. 4A shows the electric output (open-circuit voltage $V_{oc}$ (left panel) and short-circuit current $I_{sc}$ (right panel)) measurement of the as-fabricated porous CNF/PDMS film-based NG (size: 1×2 cm$^2$) under a compressive stress of 0.05 MPa at a frequency of 10 Hz at a forward connection.

FIG. 4A shows the typical electrical output of the NG under a periodic stress of ~0.05 MPa at a frequency of 10 Hz. For an NG with an effective dimension of 1 cm×2 cm×480 μm, the average values of the open-circuit voltage ($V_{oc}$) and the short-circuit current ($I_{sc}$) were found to be about 60.2 V and 10.1 μA, respectively, corresponding to a power density of ~6.3 mW/cm$^3$. These electric output signals are among the highest output signals generated by electric NGs, including conventional piezoelectric NGs, reported to date (cf. Table 1).

Letters 10 (2010) 2133-2137.) Therefore, the equivalent piezoelectric coefficient d=V×C/F=60.2×3.21/10≈19 pC/N.

Figure 4B:
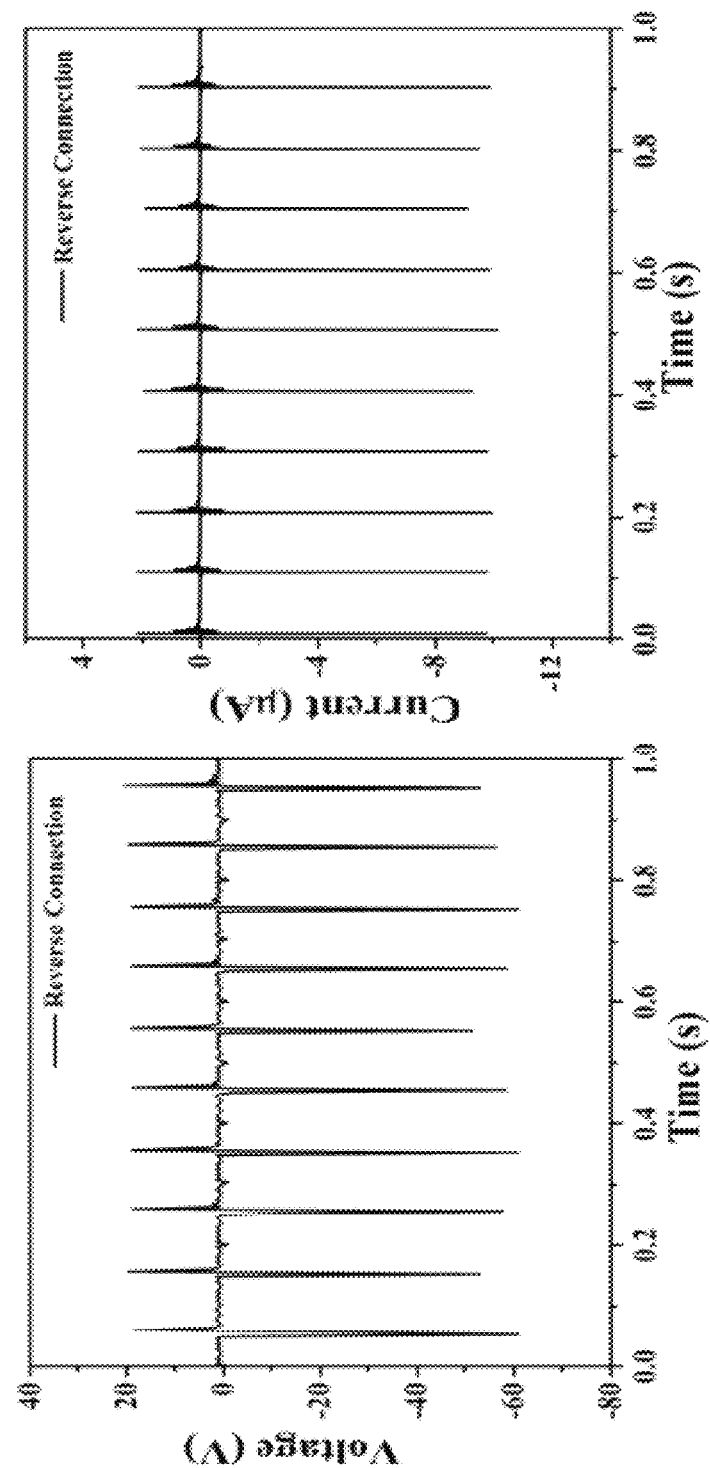
FIG. 4(B) shows the electric output (open-circuit voltage $V_{oc}$ (left panel) and short-circuit current $I_{sc}$ (right panel)) measurement of the as-fabricated porous CNF/PDMS film-based NG under a compressive stress of 0.05 MPa at a frequency of 10 Hz with a reverse connection.
Figure 4C:
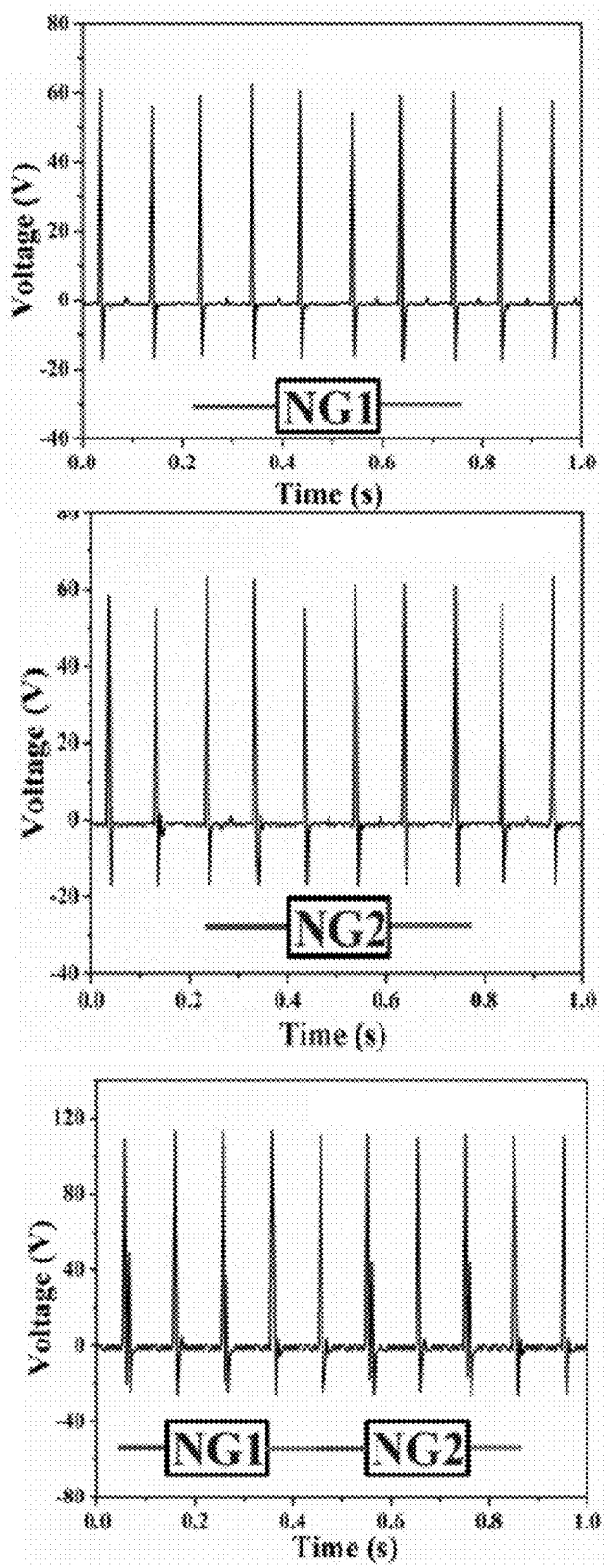
FIG. 4C shows the electric output (open-circuit voltage $V_{oc}$) measurement for two as-fabricated porous CNF/PDMS film-based NGs (NG1—top panel; and NG2—middle panel) and for the two as-fabricated porous CNF/PDMS film-based NGs connected in series (bottom panel) under a compressive stress of 0.05 MPa at a frequency of 10 Hz at the output voltage.
Figure 4D:
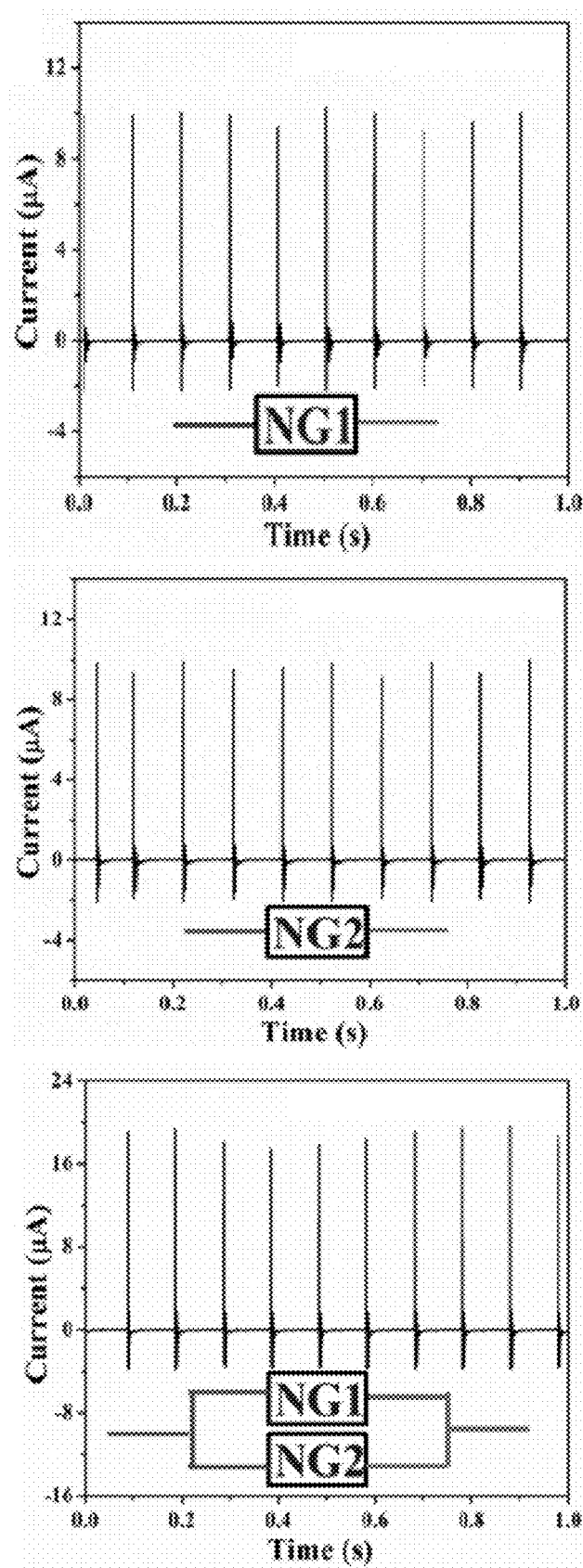
FIG. 4D shows the electric output (short-circuit current $I_{sc}$) measurement for two as-fabricated porous CNF/PDMS film-based NGs (NG1—top panel; and NG2—middle panel) and for the two as-fabricated porous CNF/PDMS film-based NGs connected in parallel (bottom panel) under a compressive stress of 0.05 MPa at a frequency of 10 Hz at the output voltage.

To confirm that the obtained electrical output signals were indeed the outputs of the NG device, the outputs of the NG device were measured under a reverse connection to the external circuit. As shown in FIG. 4B, the amplitudes of the output signals under a reverse connection were almost the same as the ones under a forward connection, albeit the polarities of the signals were reversed, indicating that the measured signals were electric outputs generated by the porous CNF/PDMS film-based NG. In order to demonstrate the excellent integratability of the porous CNF/PDMS film-based NGs, two different NGs were evaluated in both serial and parallel connections. As shown in FIGS. 4C and 4D, the $V_{oc}$ and $I_{sc}$ generated by NG1 and NG2, individually, were 60.2 V and 10.1 A, and 58.7 V and 9.6 A, respectively. When these two NGs were connected in serial, a $V_{oc}$ of 111.8 V was generated, which was only slightly (i.e., 5.8%) less than the sum of the peak Voc values for each NG (FIG. 4C). By integrating these two NGs in parallel, the resulting $I_{sc}$ reached 18.5 A. These results revealed that the voltage and

TABLE 1

The output performance of some electric nanogenerators

| Active Material | Voltage (V) | Current (μA) | Power density per volume (μW/cm$^3$) | Power density per area (μW/cm$^2$) | Reference |
|---|---|---|---|---|---|
| Porous CNF/PDMS film | 60.2 | 10.1 | 6300 | 304 | This example. |
| BTO nanotube/PDMS composite film | 5.5 | 0.35 | 64 | 1.93 | Lin et al., The Journal of Physical Chemistry Letters 3 (2012) 3599-3604 |
| Aligned ZnO nanowires | 58 | 134 | 780000 | 444 | Zhu et al., Nano Letters 12 (2012) 3086-3090. |
| BTO nanotube/P(VDF-HFP) composite film | 75 | 15 | — | 511 | Shin et al., ACS Nano 8 (2014) 2766-2773. |
| KNLN particles/Cu nanorods/PDMS composite | 12 | 1.2 | — | 1.60 | Jeong et al., Adv Funct Mater 24 (2014) 2620-2629. |
| ZnSnO$_3$ nanocubes/MWCNT/PDMS composite | 40 | 0.4 | 10.8 | 1.92 | Md Mehebub et al., Nanotechnology 26 (2015) 165403. |
| KNbO$_3$ nanowires/PDMS composite | 10.5 | 1.3 | 42 | 1.52 | Joung et al., Journal of Materials Chemistry A 2 (2014) 18547-18553. |

The equivalent piezoelectric coefficient of the PDMS/(porous CNF/PDMS aerogel film)/PDMS composite film was calculated to be approximately 19 pC/N, which was higher than the piezoelectric coefficient of perovskite/polymer composite (see, Mahadeva et al., ACS Appl Mater Inter 6 (2014) 7547-7553; and Capsal et al., J Non-Cryst Solids 356 (2010) 629-634), and comparable to that of β-PVDF (see, Sun et al., Energ Environ Sci 4 (2011) 4508-4512; and Ueberschlag et al., Sensor Review 21 (2001) 118-126). The equivalent piezoelectric coefficient (d) of the PDMS/(porous CNF/PDMS aerogel film)/PDMS composite film was calculated using the following equation:

$$V = F \times d/C, \quad (3)$$

where F is the applied force, C is the capacitance, and V is the output voltage generated by NG. (See, Chen et al., Nano current of the porous CNF/PDMS aerogel film-based NG could be enhanced by integrating NGs in either a serial or parallel connection.

The electrical power generation mechanism of the porous CNF/PDMS film-based NGs can be described as follows. Piezoelectricity in cellulose is originated from the non-centrosymmetry of the monoclinic crystal structure of cellulose I and the dipolar orientation. (See, J. Kim, et al., Ounaies, Macromolecules 39 (2006) 4202-4206.) When the NG is subjected to an external compressive stress, the CNFs are under a compressive strain. The subsequently strain-induced electric polarization will create a electric potential field between the top and bottom electrode. In order to eliminate the electric potential, positive and negative charges will accumulate at the top and bottom electrodes, thus driving the current flowing through an external circuit.

Once the stress is released, the diminishment of the electric potential leads to the back flow of the accumulated charges through the external circuit, leading to reverse electrical signals. Therefore, continuously applying and releasing the compressive force results in the generation of alternating output signals.

Figure 5A:
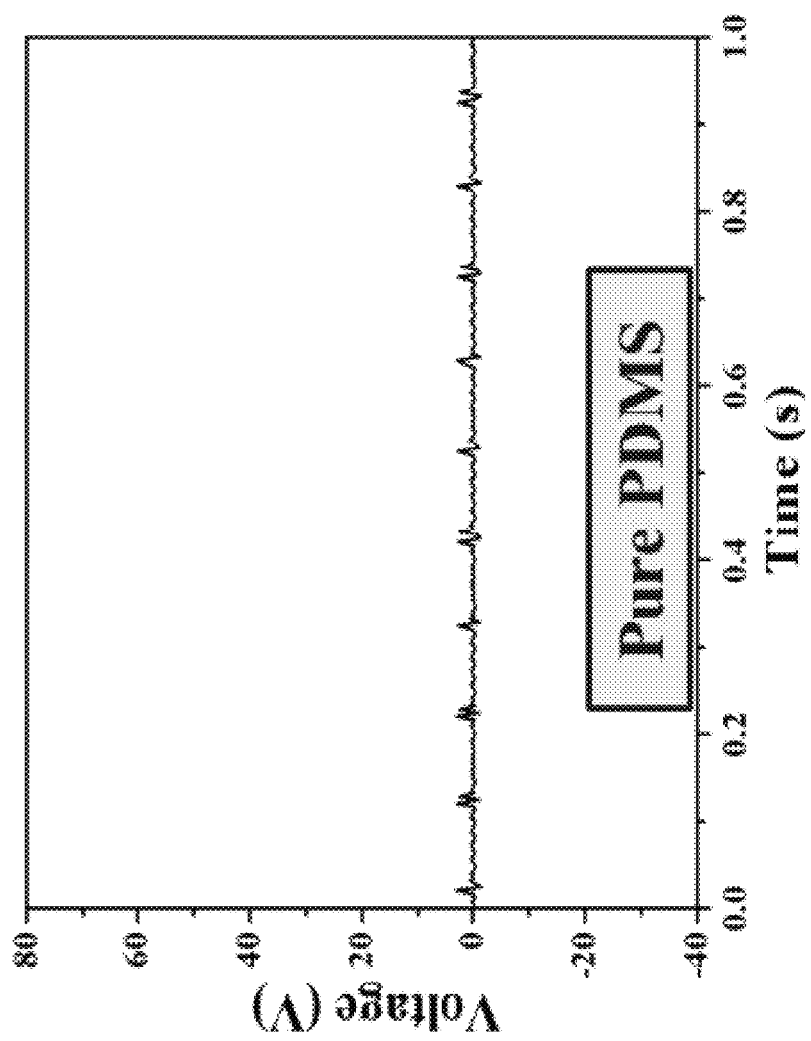
FIG. 5A shows the electric output voltage generated from NGs (sample size: 1×2 cm$^2$) fabricated by using two aluminum foils as electrodes and a PDMS layer.
Figure 5B:
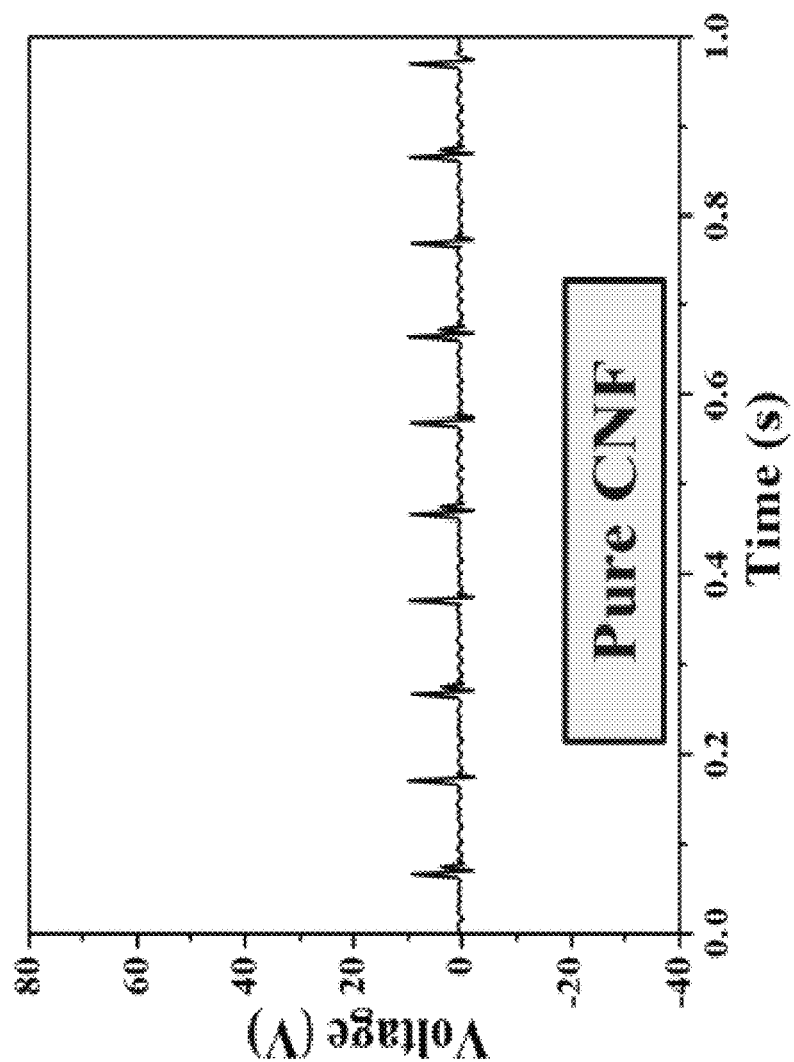
FIG. 5(B) shows the electric output voltage generated from NGs fabricated by using two aluminum foils as electrodes and a CNF aerogel film.
Figure 5C:
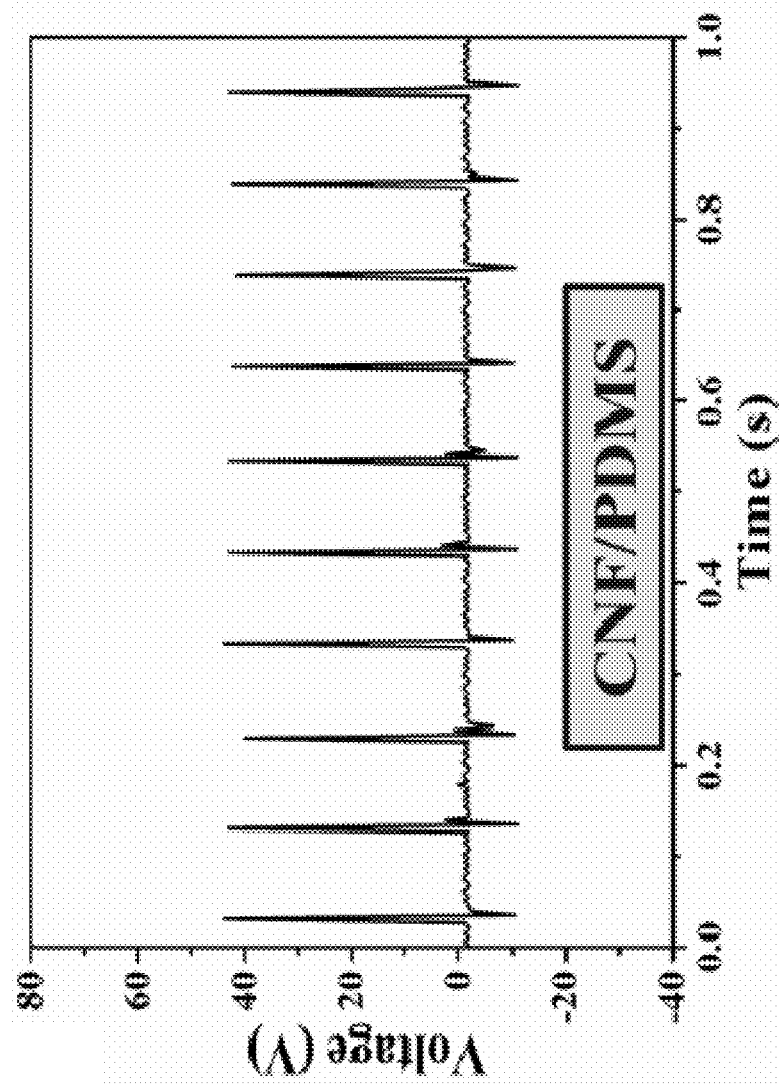
FIG. 5C shows the electric output voltage generated from NGs fabricated by using two aluminum foils as electrodes and a porous CNF/PDMS aerogel film.

In order to understand the outstanding performance of the porous CNF/PDMS aerogel film-based NGs (i.e., NGs consisting of Al/PDMS/(porous CNF/PDMS aerogel film)/PDMS/Al), three types of NGs consisting of Al/pure PDMS/Al, Al/pure CNF aerogel/Al, and Al/porous CNF/PDMS aerogel film/Al were fabricated and subjected to the same tests. As shown in FIG. 5A, there were no reliable signals from the NG containing a pure PDMS layer; some very low electrical signals may be attributed to the electrostatic charges at the aluminum electrode and PDMS interface. FIG. 5B shows the output voltage generated from NG fabricated using a pure CNF aerogel film with a $V_{oc}$ of 9.7 V, owing to the displacement or reorientation of the electric dipoles in the cellulose I crystal lattice. FIG. 5C shows the output voltage of the NG consisting of a porous CNF/PDMS aerogel film with a $V_{oc}$ of 43.3 V, which was significantly higher than the NG consisting of the CNF aerogel film.

The superior performance of the NG fabricated using the porous CNF/PDMS aerogel film could be ascribed to several factors. (1) The PDMS coating on the porous surface of the compressed CNF aerogel film not only greatly improved its mechanical robustness and flexibility, but also created electric dipoles under an oscillating mechanical stress due to the formation of free radicals. Previous studies found that homolytic cleavage of Si—O—Si bonds in a high-surface-area PDMS sponge could take place under a mechanical stress, generating numerous ≡SiO. and ≡Si. mechanoradicals. (See, B. Baytekin, et al., Energ Environ Sci 6 (2013) 3467-3482; H. T. Baytekin, et al., Angewandte Chemie International Edition 51 (2012) 3596-3600; and B. Baytekin, et al., J Am Chem Soc 134 (2012) 7223-7226.) In contrast, solid PDMS does not create free radicals as effective as PDMS sponge under a similar mechanical stress. As illustrated by the scheme in FIG. 9, mechanical stress can lead to a homolytic cleavage of the Si—O—Si covalent bonds in the porous PDMS coating of the aerogel film, thus producing abundant Si—O. (I) and O—Si. (II) mechanoradicals and leading to the formation of a large number of transient dipole moments. The electric dipole moment change resulting from the cleavage of the Si—O—Si bonds creates an electric potential between the top and bottom electrodes of a NG. This induces the accumulation of negative and positive charges at the top and bottom electrodes, thereby driving current flow through an external circuit, producing an output signals. The activation energies of the reactions between free radicals are near zero. Thus, most of these mechanoradicals will reversibly recombine to re-form the Si—O—Si bond. A smaller fraction of the Si—O. and Si. radicals can react with trace water in the air to yield silanols (III and IV), or they can extract H from neighboring $CH_3$ groups to form silanols (V) or Si—H bonds (VI) while transferring the free radicals onto the carbon atoms (VII). These silanols not only exhibit permanent electric dipole moments by themselves, but can also undergo hydrogen bonding, leading to an increase in the density of electric dipoles and, consequently, enhancing the electric output.

Figure 5D:
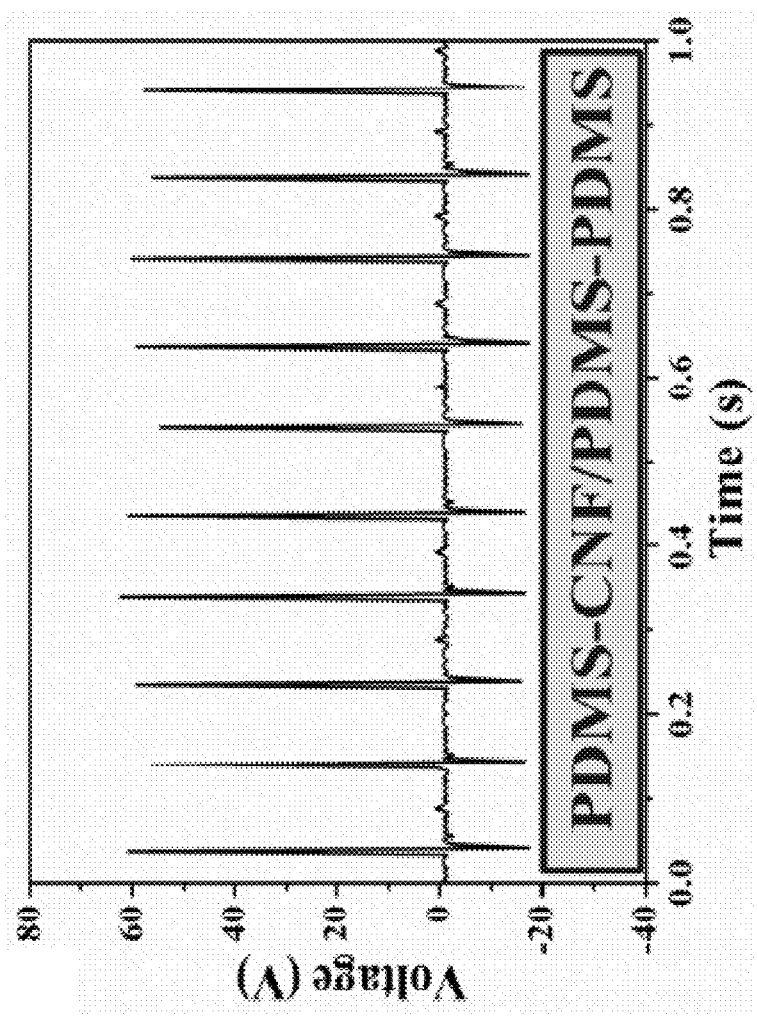
FIG. 5D shows the electric output voltage generated from NGs fabricated by using two aluminum foils as electrodes and a porous CNF/PDMS aerogel film sandwiched between two pure PDMS layers (~100 μm).
Figure 10:
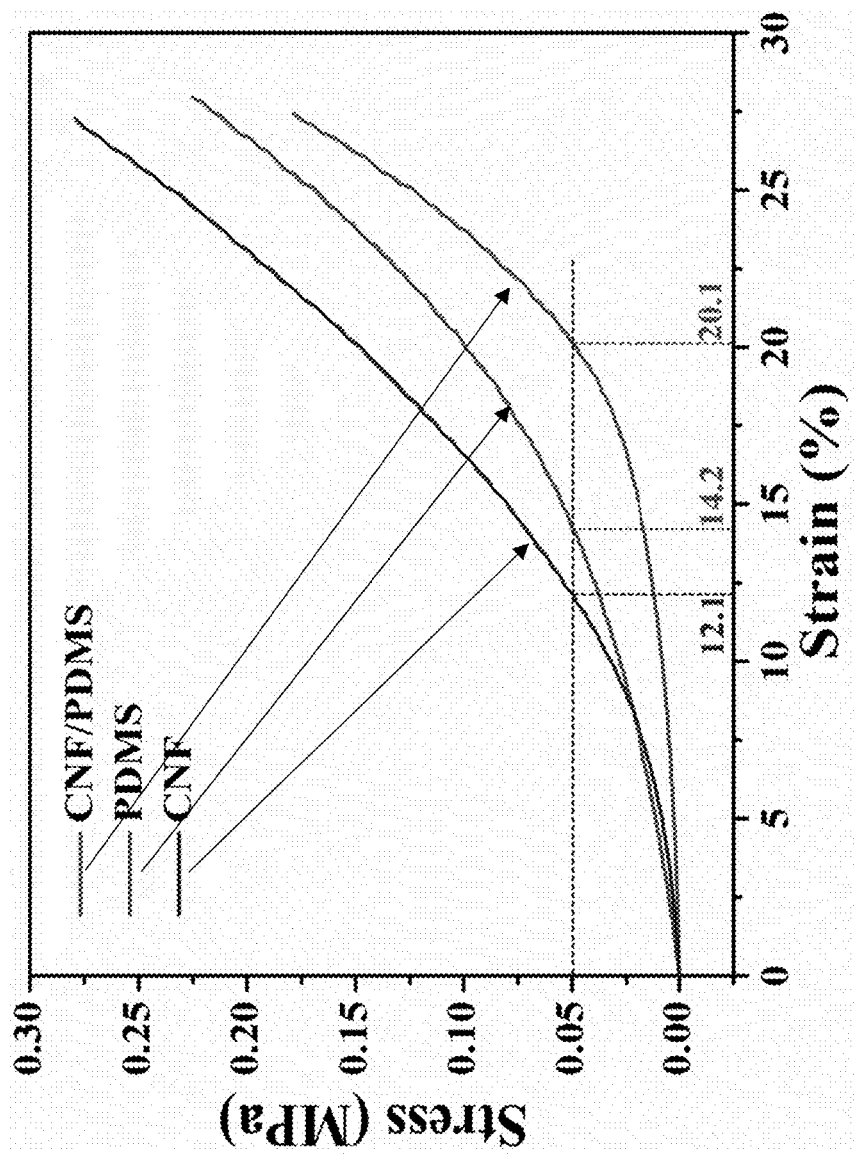
FIG. 10 shows the compressive stress-strain curves of the compressed CNF aerogel film, the pure PDMS film, and the porous CNF/PDMS aerogel film.

As shown in FIG. 10, the porous CNF/PDMS film exhibited a higher compressive strain compared to the pure PDMS film and the compressed CNF aerogel film under the same compressive stress. Previous studies demonstrated that larger mechanical deformation was beneficial for NGs to generate higher outputs. (See, J. H. Jung, et al., ACS Nano 5 (2011) 10041-10046.) As shown in FIG. 5D, the output voltage was further enhanced by spin-casting a PDMS layer on both sides of the CNF/PDMS aerogel film. This was attributed to the fact that the spin-coated PDMS layer on both sides of the porous CNF/PDMS aerogel film made the surfaces of the porous CNF/PDMS film smoother, which could provide high potential barriers thereby preventing charge leakage and more effectively transfer the compressive stress to the porous CNF/PDMS aerogel film, thereby enhancing the performance of the NGs. Furthermore, the PDMS layers also served as buffer layers protecting the porous CNF/PDMS film from a direct hit, thereby improving the NG's robustness.

Figure 6A:
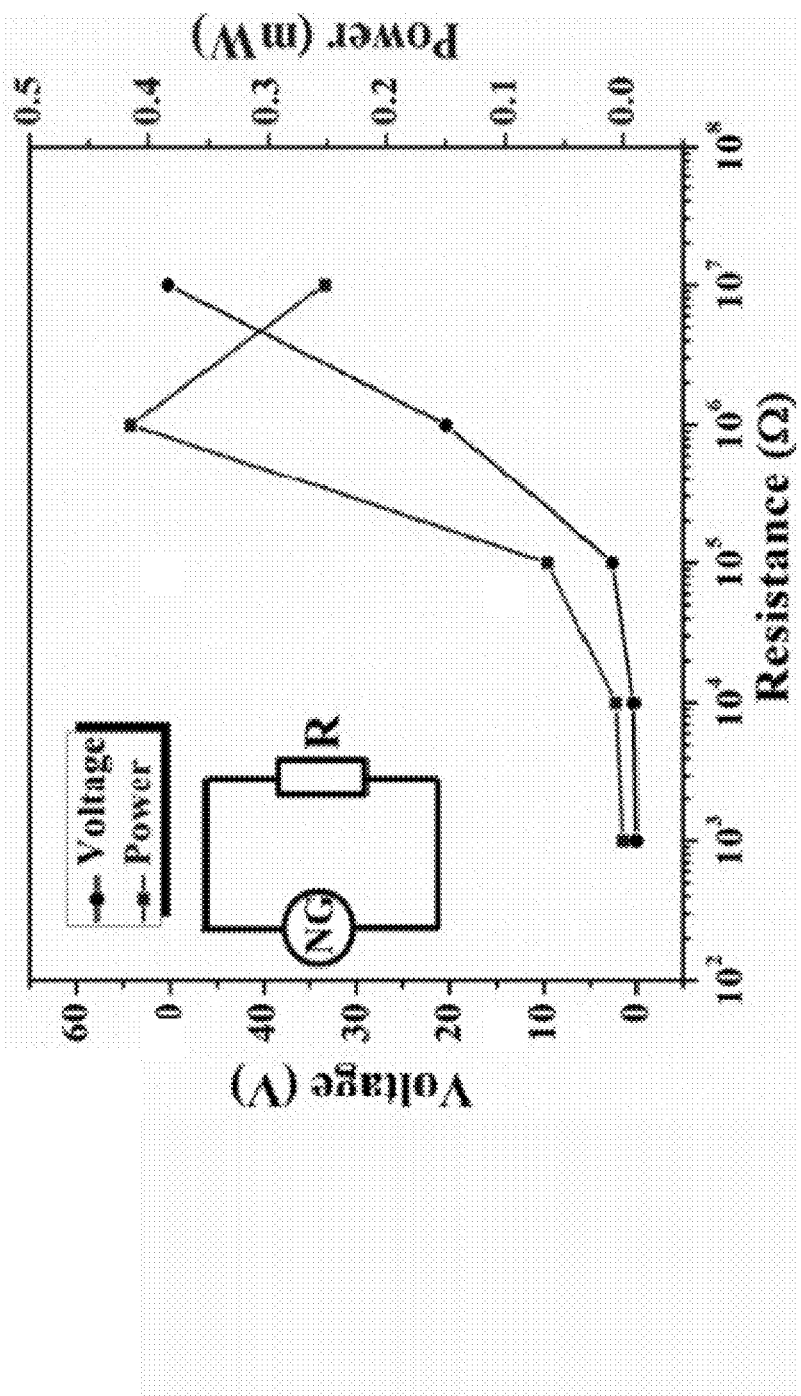
FIG. 6A shows the output voltage and instantaneous output power as a function of load resistance. The inset shows the equivalent circuit.

To investigate the output power matching of the NGs, resistors with different resistance values ($10^3 \sim 10^7 \Omega$) were connected to the NG as external loads. As shown in FIG. 6A, the output voltage through the external resistor gradually rose with an increasing resistance. In contrast, the instantaneous output power ($W=V^2_{oc}/R$) on the external load by the porous CNF/PDMS film-based NG reached to a maximum value of about 0.42 mW at a resistance of 1 MΩ (FIG. 6A).

Figure 6B:
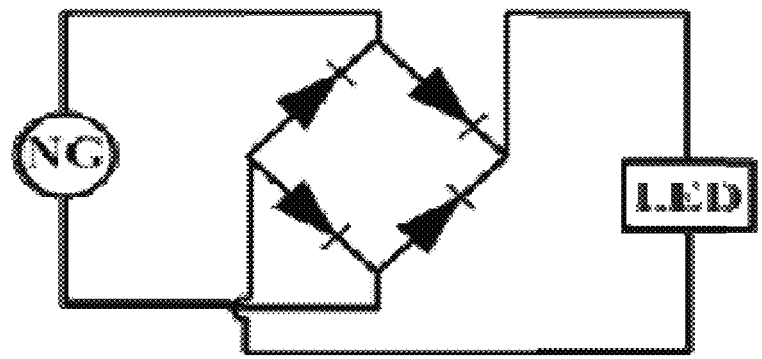
FIG. 6(B) shows the equivalent circuit for nineteen blue LEDs in series simultaneously turned on by the electricity generated by the porous CNF/PDMS aerogel film-based NG.
Figure 6C:
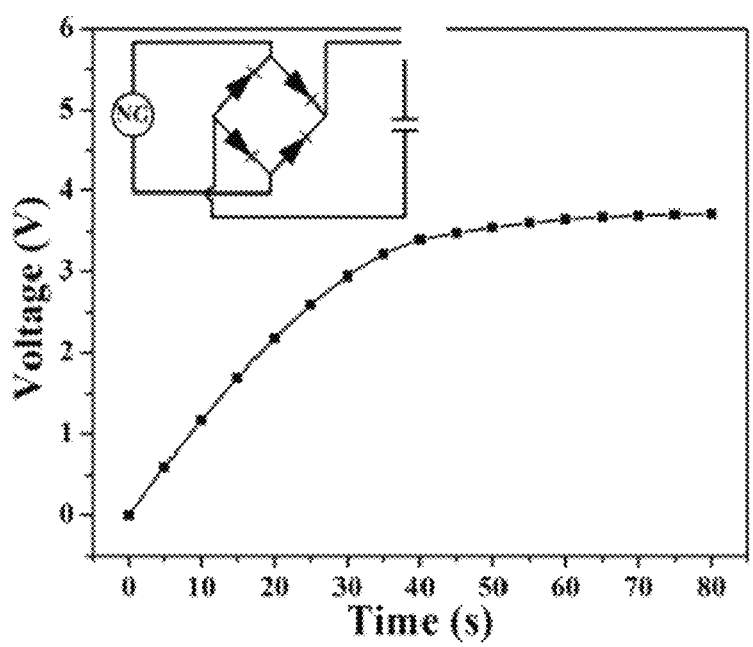
FIG. 6C shows the charging curve of a capacitor by a NG under a compressive stress of 0.05 MPa at a frequency of 10 Hz.

To demonstrate the practical application of porous CNF/PDMS aerogel film-based NGs, a NG was connected to 19 blue LEDs through a commercial bridge rectifier consisting of four diodes, as shown by the equivalent circuit in FIG. 6B, which converted the generated alternating current (AC) output into direct current (DC). The 19 blue LEDs (with an operation voltage of 2.6 V) in series, which formed the letters "UW", were directly turned on by the NG without the aid of a capacitor. Furthermore, in order to store the electric power generated by the NGs, a capacitor (22 µf) was connected to the NG through a bridge rectifier. As shown in FIG. 6C, the capacitor could be charged up to ~3.7 V under a compressive stress of 0.05 MPa at a frequency of 10 Hz.

Figure 6D:
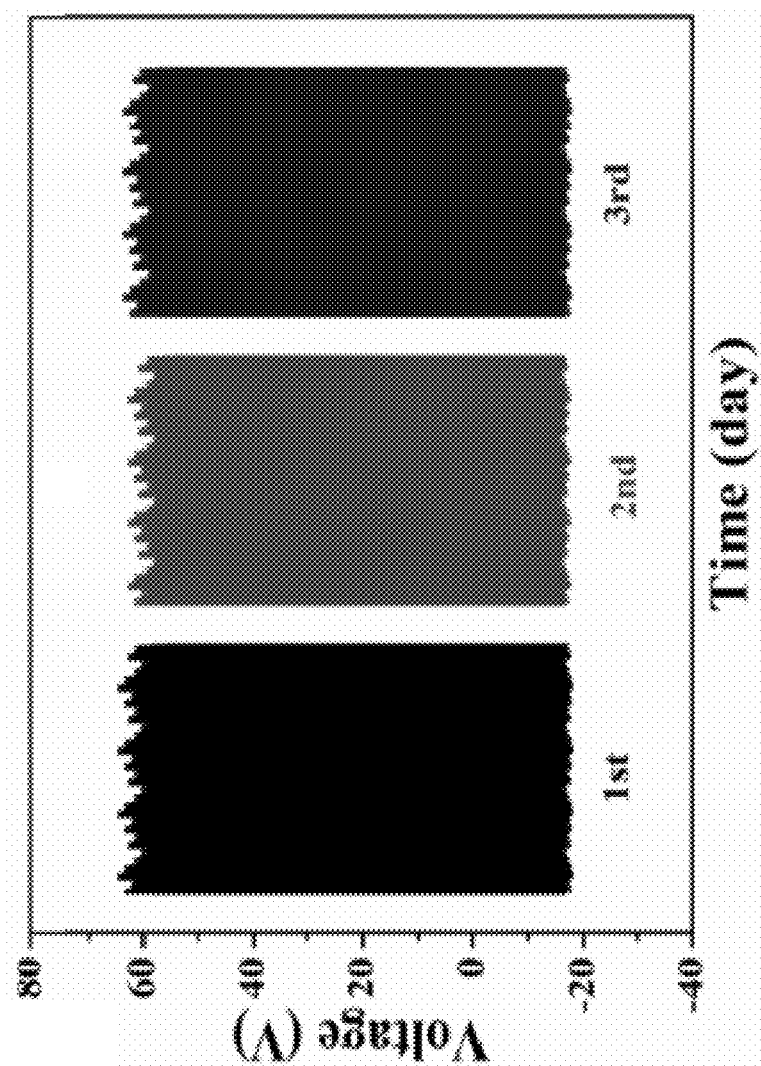
FIG. 6D shows the stability test of the NG on the first, second, and third day of operation (1200 cycles per day).
Figure 11:
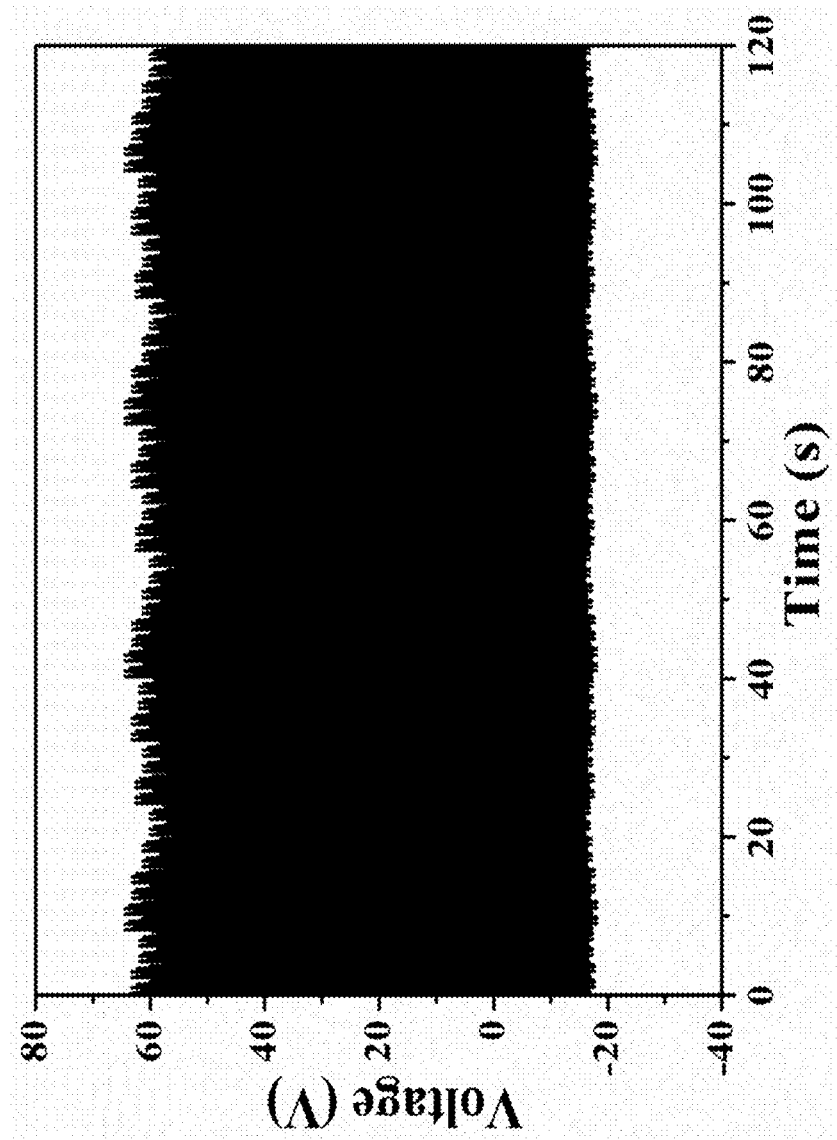
FIG. 11 shows the output voltage measurement of the NG after one month (1200 cycles).
Figure 12:
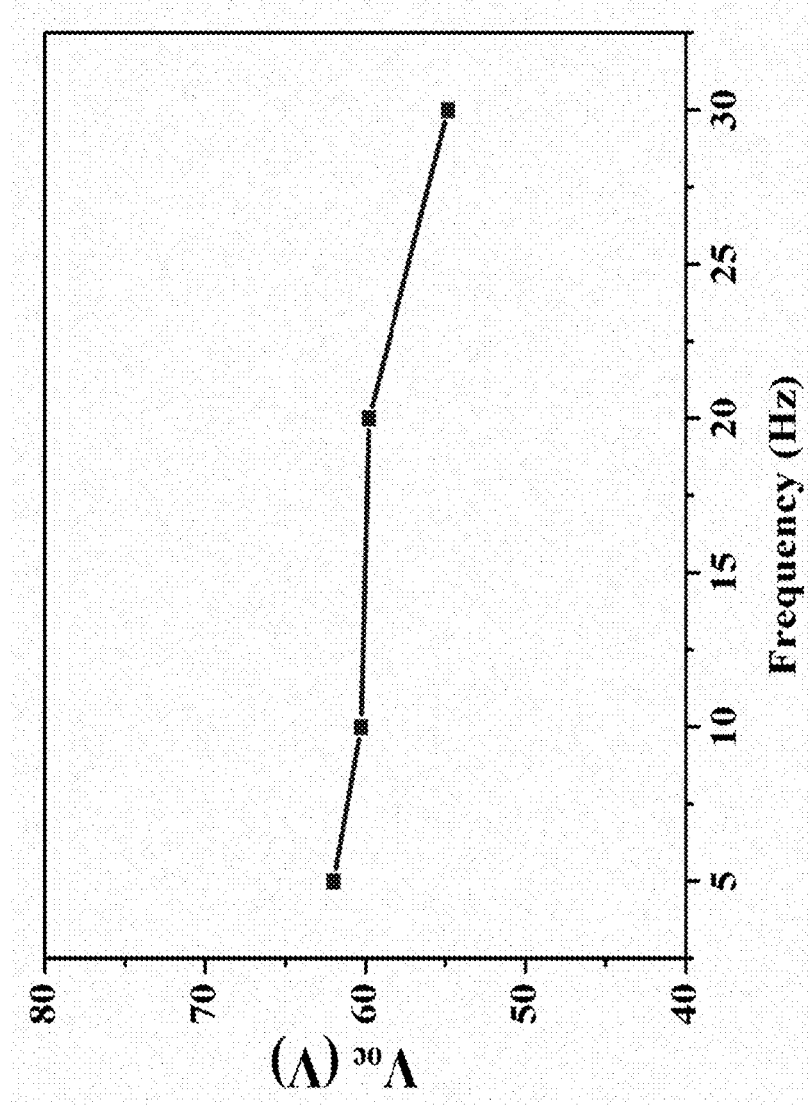
FIG. 12 shows the open circuit voltage (Voc) of the NGs (sample size: 1×2 cm$^2$) measured under various frequencies.

The stability and reliability of the NGs were evaluated by continuously applying and releasing a compressive stress for 1200 cycles per day. As shown in FIG. 6D, the output voltage signals did not show an obvious change after three days. In addition, the output performance did not deteriorate even if the NG device was measured again after one month (FIG. 11). Furthermore, it has been demonstrated that the output performance of the NGs was quite stable under various frequencies. For instance, the open circuit voltage ($V_{oc}$) of the NGs only decreased slightly as increasing frequency (FIG. 12). This superior stability/reliability of the NG devices is attributed to the flexible and robust characteristics of the raw materials (i.e., CNFs and PDMS), as well as the unique structure of the NGs.

CONCLUSIONS

A novel, scalable, and integratable flexible NG based on a porous CNF/PDMS aerogel film has been designed and fabricated. The flexible NGs can reliably and repeatedly generate remarkable electric outputs, such as an open-circuit voltage ($V_{oc}$) of 60.2 V, a short-circuit current ($I_{sc}$) of 10.1 µA, and a corresponding power density of 6.3 mW/cm$^3$. The electric power generated by such a NG can directly turn on 19 blue LEDs or charge a capacitor up to 3.7 V. Compared to previously reported NGs, the porous CNF/PDMS aerogel film-based NG possesses several unique advantages that are crucial for developing self-powered systems. First, the use of CNFs, a bio-based and biocompatible natural polymer, addresses both safety and environmental concerns affiliated with some other types of materials and allows the CNF/PDMS aerogel film-based NG to be potentially used to harvest energy inside of biological systems. Second, the fabrication process is simple, scalable, and environmentally friendly. It also completely avoids the traditional electrical poling steps often required by piezoelectric materials, thereby making this technique more reliable and more widely applicable while saving energy. Third, the NG exhibits high flexibility and outstanding stability/reliability due to the flexible and robust nature of the raw materials (i.e., CNFs and PDMS) and the unique structure of the NG. Considering its excellent performance, ease of large-scale manufacturing, and environmental friendliness, the porous CNF/PDMS film-based NG may be useful for many applications in flexible electronics and biocompatible self-powered systems.

Example 2

Experimental Section

Preparation of CNF/CNC Aerogels 0.9 wt. % CNF/CNC suspensions were prepared as follows. First, a desired amount of water, CNC powder and CNF suspension were mixed together in a beaker under mechanical stirring for 30 min. to achieve a homogenous dispersion. The weight ratios between the CNF and CNC were 1:1 and 1:3, respectively. To be specific, CNF/CNC-50 and CNF/CNC-75 were CNF/CNC aerogels with 50 and 75 wt. % of CNC, respectively. The solid content of CNF/CNC was always kept at 0.9 wt. %. The resulting suspension was then sonicated (UP400S, Hielscher USA) at 80% amplitude using a 3 mm probe in an ice bath for 30 min. Afterward, the CNF/CNC suspension was transferred to centrifuge tubes which were subsequently centrifuged at 4000 r/min. for 10 min. to remove any bubbles. The CNF/CNC suspension (20 mL) in an aluminum pan was frozen in a dry ice-acetone solution at −78° C. The CNF/CNC aerogel was obtained by a freeze-drying process as previously reported.

Preparation of Carboxymethyl Cellulose (CMC) Aerogels 0.9 wt. % CMC suspensions were prepared as follows. A desired amount of CMC powder was gradually added into the 20 mL water under mechanical stirring for 1 hr. to obtain a homogenous solution. Afterward, the resulting CMC solution was transferred to centrifuge tubes that were centrifuged at 4000 r/min. for 10 min. to remove any bubbles. The CMC aerogel was obtained by freeze-drying the CMC solution as previously reported.

Preparation of Chitosan Aerogels

Hydrochloric acid (0.5 mL, 37 wt. %) and chitosan (180 mg) were added into 20 mL water under mechanical stirring for 1 hr. to obtain a homogenous solution. Afterward, the resulting solution was transferred to centrifuge tubes that were centrifuged at 4000 r/min. for 10 min. to remove any bubbles. The chitosan aerogel was obtained by freeze-drying the chitosan solution as previously reported.

Preparation of Porous CNF/CNC/PDMS Films

The CNF/CNC aerogels were compressed into aerogels films under a pressure of 0.5 MPa. PDMS prepolymer, curing agent, and ethyl acetate were mixed at the ratio of 10:1:20 to achieve a dilute PDMS solution. Afterwards, the aerogels films were coated with the resulting PDMS solution using a vacuum-assisted liquid filling method. Then the PDMS-coated compressed CNF/CNC aerogel films were left in a fume hood at room temperature for about 2 hrs. to vaporize the ethyl acetate followed by curing at 100° C. for 1 hr. Other types of aerogels, including the CMC and chitosan aerogels, were coated with PDMS using a similar procedure.

Fabrication of Compact Flexible Nanogenerators (NGs)

First, to make the porous CNF/CNC/PDMS aerogel film more robust under mechanical stress or deformation, a thin solid PDMS layer (~100 μm) was spin-coated on both sides of the aerogel film. The PDMS solution used here was made by mixing a PDMS prepolymer and curing agent at a ratio of 10:1, without any organic solvent. To fabricate the porous CNF/CNC/PDMS aerogel film-based NG having a five-layer structure (i.e., Al/PDMS/(porous CNF/CNC/PDMS aerogel film)/PDMS/Al), the sandwich-like PDMS/(porous CNF/CNC/PDMS aerogel film)/PDMS composite film was first cut into 1 cm×2 cm pieces. Thereafter, both sides of the PDMS/(porous a/PDMS aerogel film)/PDMS composite film were attached with aluminum foils as electrodes. Various nanogenerators based on other types of porous aerogel/PDMS films were fabricated using the same procedure.

Characterization and Electric Measurement

The NGs were mechanically triggered by an oscillator (LDS V201, Brüel & Kjær, Denmark) that provided a dynamic impact with controlled force and frequency. The electric output signals of the NGs were recorded using an oscilloscope (DS1102E, Rigol, China) and a potentiostat (versaSTAT-3, Princeton Applied Research, USA).

Discussion

Figure 13A:
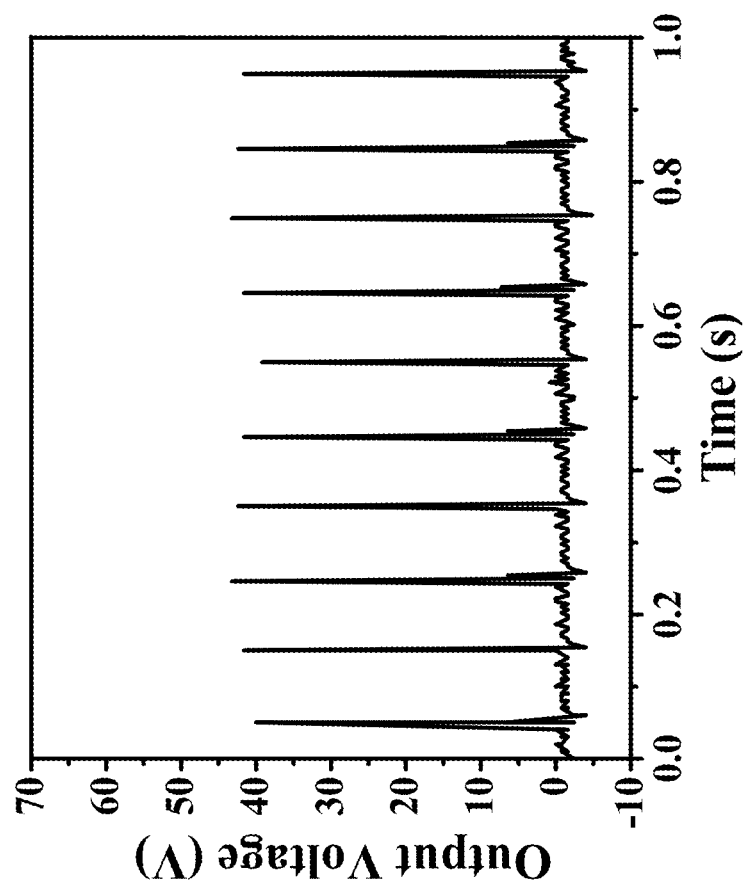
FIG. 13A shows the electric output voltage generated from NGs fabricated by using a porous CNF/PDMS aerogel film under a compressive stress of 0.05 MPa at a frequency of 10 Hz.
Figure 13B:
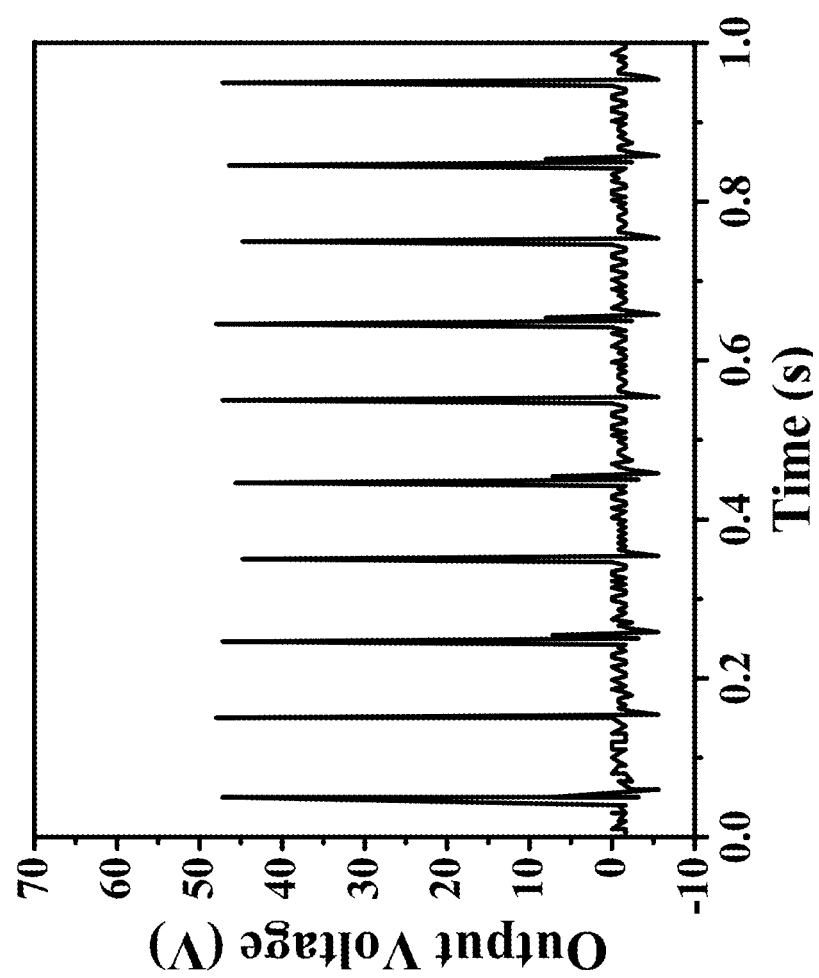
FIG. 13(B) shows the electric output voltage generated from NGs fabricated by using a porous CNF/CNC-50/PDMS aerogel film under a compressive stress of 0.05 MPa at a frequency of 10 Hz.
Figure 13C:
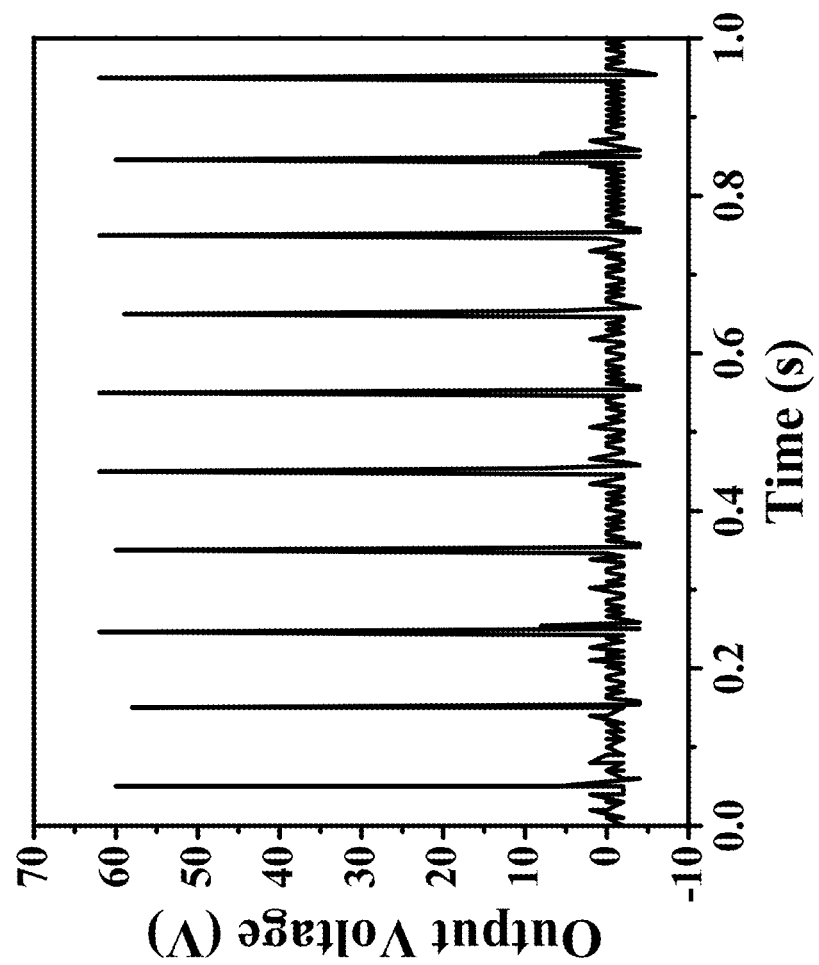
FIG. 13C shows the electric output voltage generated from NGs fabricated by using a porous CNF/CNC-75/PDMS aerogel film under a compressive stress of 0.04 MPa at a frequency of 10 Hz. (sample size: 1×1.2 cm$^2$).

FIGS. 13A-13C show the typical output of the NGs under a periodic stress of ~0.04 MPa at a frequency of 10 Hz. FIG. 13A shows the output voltage from NG fabricated using a porous CNF/PDMS aerogel film with a $V_{oc}$ of 40.2 V. As shown in FIG. 13B, the output voltage of the NG was increased to 47.5V after incorporating 50% CNC into the CNF/CNC aerogels. It was found that the $V_{oc}$ could be further increased to 60.5V after adding 75% CNC into the CNF/CNC aerogel (FIG. 13C). This was attributed to the fact that CNCs exhibit a stronger electric effect than CNFs under similar testing conditions.

The remarkable electric generation properties of the porous CNF/PDMS aerogel films were attributed to the mechanoradicals generated by the porous PDMS, leading to the formation of a large number of polar groups and subsequently inducing a high density of electric dipole moments (i.e., higher polarization density). To verify this, several other types of aerogel films, including chitosan and CMC aerogel films, were also fabricated. The aerogel films were used to assemble the NGs by using a similar procedure discussed above. CMC intrinsically is a non-piezoelectric material. However, after coating with PDMS, the porous CMC/PDMS aerogel film based NG can reliably generate very high output voltage (i.e., 35.2V), indicating that the mechanoradicals generated by the porous PDMS are responsible for the electric effect exhibited by the porous CMC/PDMS aerogel film. Chitosan itself is a piezoelectric material, which may explain why a higher electric output voltage (i.e., 48.1V) was observed by the porous chitosan/PDMS aerogel films in comparison with that of the CMS/PDMS aerogel films.

Example 3

This example demonstrates high-performance flexible compact NGs using porous aerogel films that exhibit significant electric outputs without the use of traditional piezoelectric materials or the need of an airgap. Carboxymethyl cellulose (CMC), a non-piezoelectric material, was used to prepare the porous aerogel films (i.e., porous CMC/poly (dimethyl siloxane) (PDMS) aerogel films) for NGs without any airgap. The method of forming the NGs is shown schematically in FIG. 14, panels (a) through (g). The porous CMC/PDMS aerogel film was first engineered by coating a compressed porous CMC aerogel film with a thin layer of PDMS, and then sandwiching the aerogel film between two thin PDMS films, followed by two aluminum foils, to form the flexible compact NG. Under a periodic stress of ~0.05 MPa at a frequency of 10 Hz, the resulting flexible porous CMC/PDMS aerogel film-based compact NGs (1 cm×1.2 cm×540 µm) delivered an open-circuit voltage ($V_{oc}$) of 30.0 V and a short-circuit current ($I_{sc}$) of 4.5 µA, corresponding to a power density of 1.1 W/m². The remarkable electric outputs of the porous CMC/PDMS aerogel film could be attributed to the mechanoradicals generated by the porous PDMS coated on the surface of the CMC aerogel film, which can lead to a change in the electric dipole moments and consequently enhance the electric outputs. To verify this, the effects of porosity, the amount of free radical scavenger present in the porous PDMS coating of the CMC aerogel film, and the different types of polymer coatings (e.g., PDMS, thermoplastic polyurethane (TPU), and a blend of poly(n-butyl acrylate) (PBA) and poly(n-butyl methylacrylate) (PBMA)) with varying degrees of ability to generate mechanoradicals on the electric outputs of the CMC aerogel film-based NGs, were systematically studied. Furthermore, the effects of different types of aerogel films (e.g., CMC, chitosan (CTS), and polyvinyl alcohol (PVA)) on the electric outputs of the flexible porous polymer films have also been studied. These studies supported the conclusion that flexible porous polymer films capable of efficiently generating mechanoradicals can lead to high performance flexible NGs without the need for electric poling and without the need of airgap. This new class of flexible porous polymers can lead to many potential applications. This study also provides a simple, low-cost, universally applicable method for fabricating high-performance, flexible NGs.

Experimental Section

Materials

Sodium carboxymethyl cellulose (CMC, average $M_w$~90 kDa), chitosan ($M_w$: 50-190 kDa), poly(butyl methacrylate) (PBMA, average $M_w$~337 kDa), and poly(butyl acrylate) (PBA, average $M_w$~99 kDa, 25-30 wt % in toluene) were purchased from Sigma-Aldrich. The material 2,2,6,6-tetramethyl-1-piperidinyloxy (TEMPO) was purchased from Oakwood Chemical. PDMS was purchased from Dow Corning. All other chemicals were purchased from Sigma-Aldrich and used without further purification.

Preparation of Compressed CMC Aerogel Film

Figure 14:
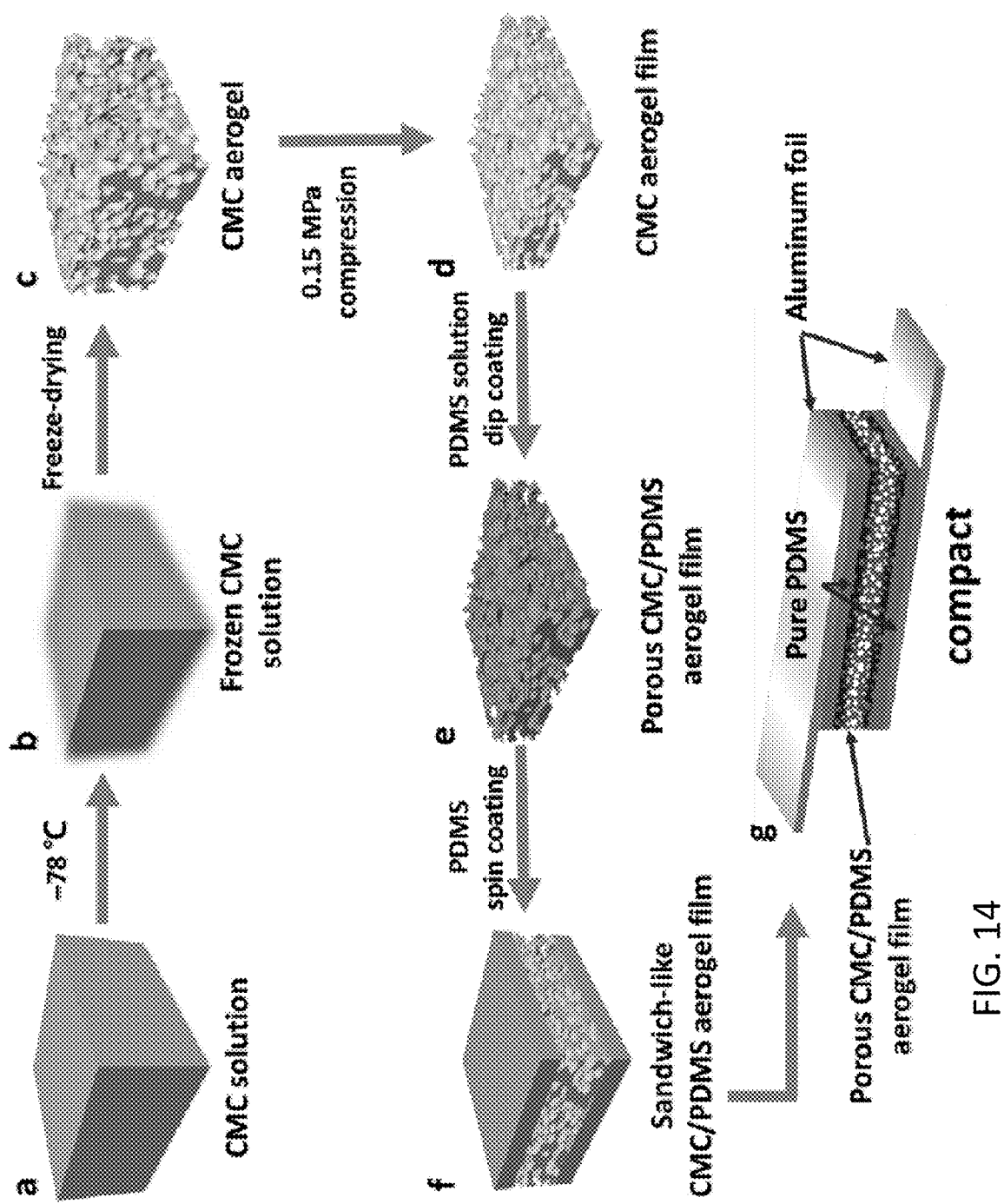
FIG. 14 is a schematic illustration of the preparation of a porous CMC/PDMS aerogel film-based electric NG. Panel (a) shows a CMC solution; panel (b) shows a frozen CMC solution; panel (c) shows a CMC aerogel; panel (d) shows a compressed CMC aerogel film; panel (e) illustrates a porous CMC/PDMS aerogel film; panel (f) depicts a sandwich-like PDMS/(CMC/PDMS aerogel film)/PDMS structure; and panel (g) shows a porous CMC/PDMS aerogel film-based compact triboelectric NG (i.e., without an airgap) with a five-layer structure.

CMC (0.200 g) was dissolved in 20 mL of water in an aluminum pan (diameter: 5.80 cm) (FIG. 14, panel (a)). The resulting CMC solution was frozen in a dry ice-acetone solution at −78° C. (FIG. 14, panel (b)). The CMC aerogel was obtained after a freeze-drying process as previously reported (FIG. 14, panel (c)). (See, Q. Zheng, et al., ACS applied materials & interfaces 7 (2015) 3263-3271; and Q. Zheng, et al., Journal of Materials Chemistry A 2 (2014) 3110-3118.) The CMC aerogel samples were compressed into aerogel films under a pressure of 0.15 MPa (FIG. 14, panel (d)).

Fabrication of Porous CMC/PDMS Aerogel Film-Based NGs

A PDMS solution was prepared from a PDMS prepolymer, curing agent (Sygard 184, Dow Corning), and ethyl acetate at a ratio of 10:1:20. The compressed CMC aerogel was then dipped into the PDMS solution using a vacuum-assisted liquid filling method to enable the solution to penetrate into the inner pores (FIG. 14, panel (e)). The well-coated aerogel film was left in a hood for 2 h to vaporize the solvent and then cured at 100° C. for 1 h.

The CMC/PDMS aerogel film was spin-coated on both sides with a PDMS prepolymer and curing agent mixture (without any solvent) at a 10:1 ratio. The sample was cured again at 100° C. for 1 h (FIG. 14, panel (f)). The resulting PDMS/(porous CMC/PDMS aerogel film)/PDMS sandwich-like tri-layer film was cut into pieces (1 cm×1.2 cm in area, 540 µm in thickness). Thereafter, aluminum foil was affixed to both sides of the tri-layer film sample to obtain the NG shown in (FIG. 14, panel (g)). For comparison, NGs made of either pure PDMS film or pure CMC aerogel film were also prepared.

Characterization of the Materials and NGs

A scanning electron microscope (SEM, LEO GEMINI 1530) was used to study the microstructures of these samples after gold sputtering. Thermal stability measurements were carried out using a thermogravimetric analyzer (TGA, Q50 TA Instruments, USA) from 30 to 800° C. at a 10° C./min heating rate under N2 protection. The dynamic impact with controlled force and frequency was generated by an oscillator (LDS V201, Brûel & Kjær, Denmark). The electrical output signals of the NGs were recorded using an oscilloscope (DS1102E, Rigol, China) and a potentiostat (versaSTAT-3, Princeton Applied Research, USA). All tests were done at least in triplicate and the most representative curves and results were reported.

Results and Discussion

The NG was composed of five layers, as schematically shown in FIG. 14, panel (g). The outermost layers were individual sheets of aluminum foil serving as the top and bottom electrodes. The secondary outer layers were two individual pure/solid spin-coated PDMS films which can not only significantly enhance the robustness of the NG, but can also enable the NG to efficiently harvest mechanical energy. The innermost layer—i.e., the electric generation material of the NG with a sandwich structure—was prepared by coating a layer of PDMS (~90 µm) on the porous surface of the compressed CMC aerogel film.

The microstructure of the CMC aerogel is shown in FIG. 15A. The CMC aerogel displayed a highly porous and interconnected structure with a porosity of 99%. The microstructure of the compressed CMC aerogel film is shown in FIGS. 15B and 15C. The compressed CMC aerogel film still exhibited a highly porous structure (90% porosity). The compressed highly porous CMC aerogel film with interconnected pores can greatly facilitate the absorption of the PDMS prepolymer/ethyl acetate solution, thereby leading to a complete PDMS coating on the porous surface of the compressed CMC aerogel, as shown in the SEM image of the CMC/PDMS film (FIG. 15D). The porosity of the resulting porous CMC/PDMS aerogel film was 40%. Thereafter, two pure/solid PDMS thin layers (~90 µm) were spin-casted on both sides of the CMC/PDMS aerogel film as shown in FIG. 15E. The CMC/PDMS aerogel film was very flexible and could easily be rolled up. The thermal stability of the porous CMC/PDMS film was investigated using a thermogravimetric analyzer (TGA) in a $N_2$ atmosphere from 30° C. to 800° C. The porous CMC/PDMS aerogel film was stable up to 295° C.

FIG. 16A shows the representative electric outputs of the porous CMC/PDMS aerogel film-based compact NG without an airgap under a periodic stress of ~0.05 MPa at a frequency of 10 Hz. For a NG with a dimension of 1 cm×1.2 cm×540 µm, the average values of the open-circuit voltage ($V_{oc}$) and short-circuit current ($I_{sc}$) were around 30.0 V and 4.5 μA, respectively. The power density was calculated to be about 1.1 W/m².

Figure 16B:
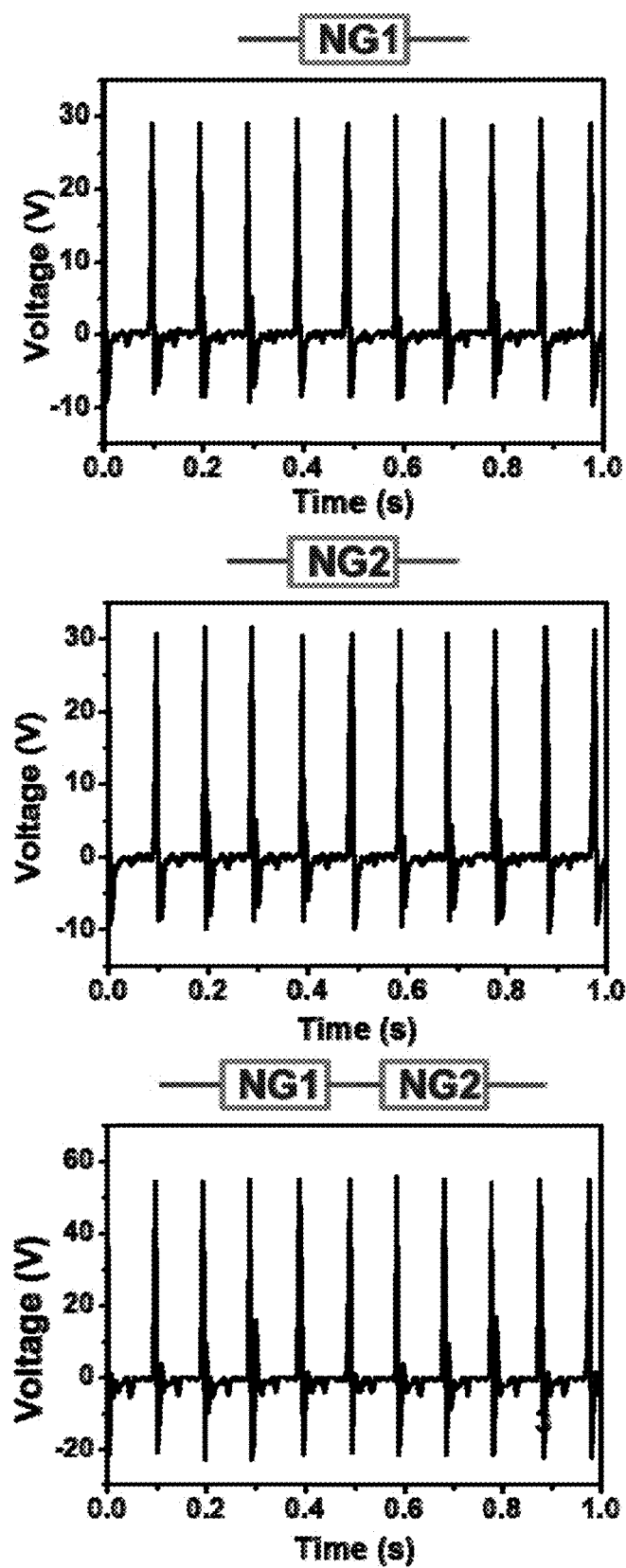
FIG. 16B shows that $V_{oc}$ was combined by connecting two different NGs in series and parallel.
Figure 16C:
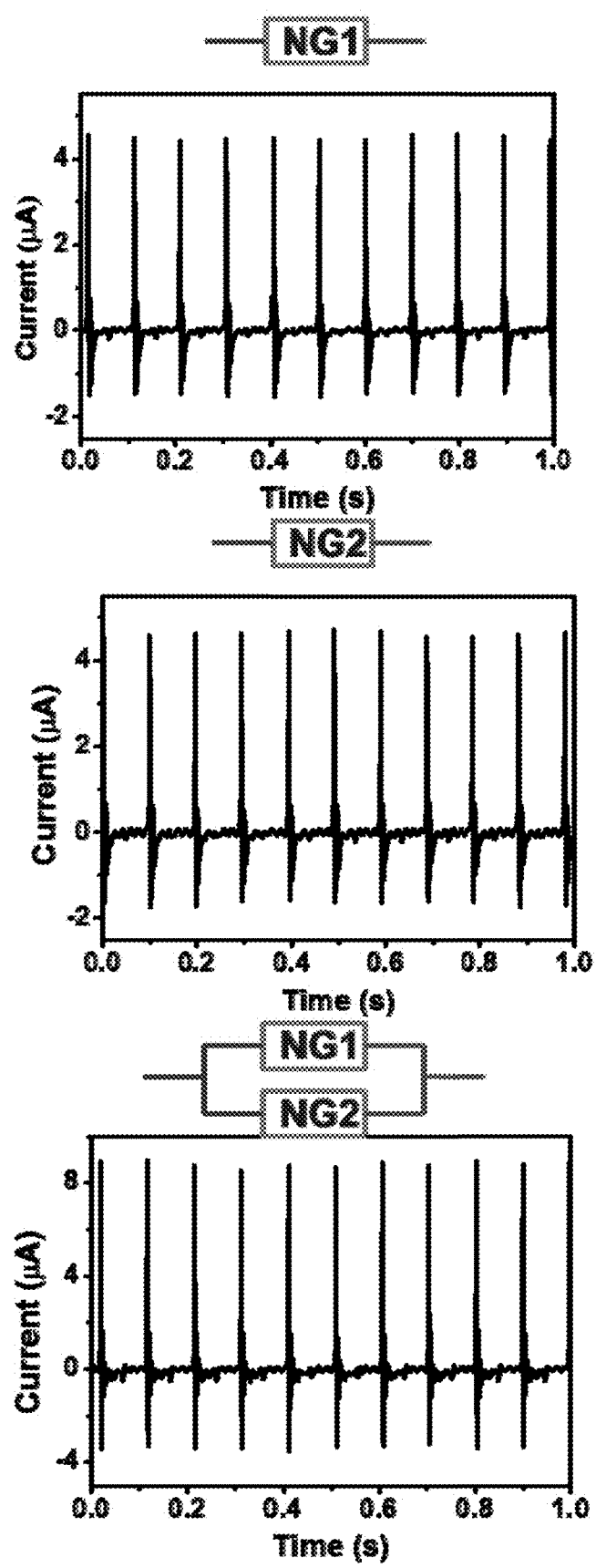
FIG. 16C illustrates that $I_{sc}$ was combined by connecting two different NGs in series and parallel.

In order to investigate the integratability of the porous CMC/PDMS aerogel film-based compact NGs, the output signals of two different NGs were measured in both series and parallel connections. As shown in FIG. 16B, the $V_{oc}$ generated by integrating two NGs connected in series exceeded 58 V, which is similar to that of the sum of the $V_{oc}$ values for each NG separately. Moreover, as shown in FIG. 16D, the $I_{sc}$ generated by two NGs connected in parallel reached 8.7 μA, which is almost identical to the sum of the $I_{sc}$ values for each NG separately.

Figure 17C:
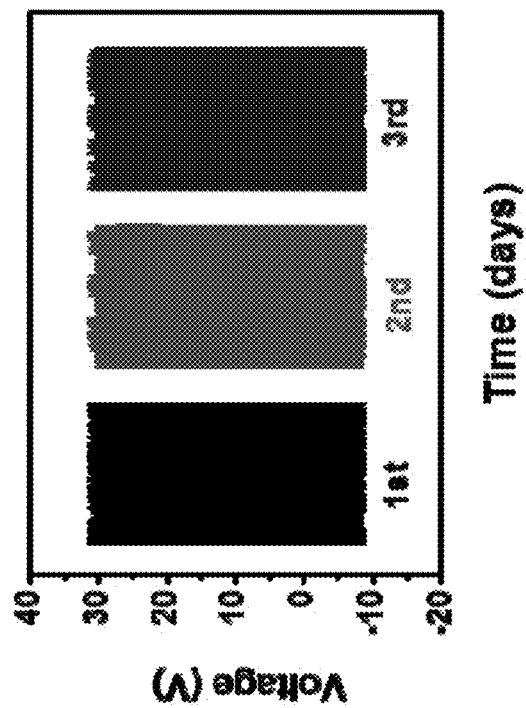
FIGS. 17A-17C depict the output performance and stability of a porous CMC/PDMS aerogel film-based compact NG.
Figure 17A:
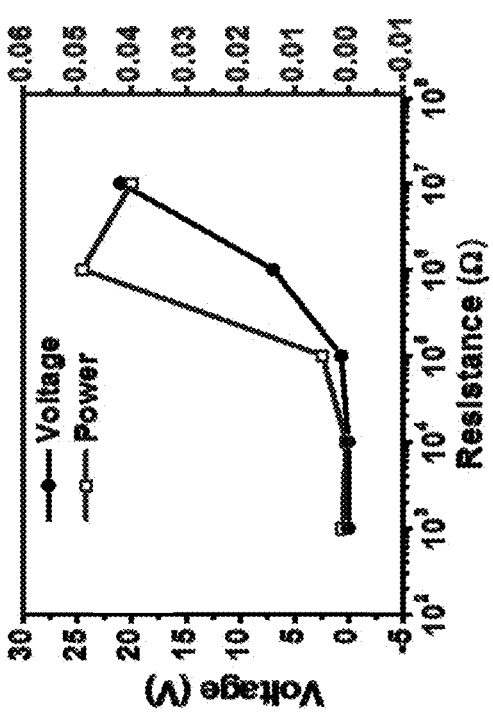
Figure 17B:
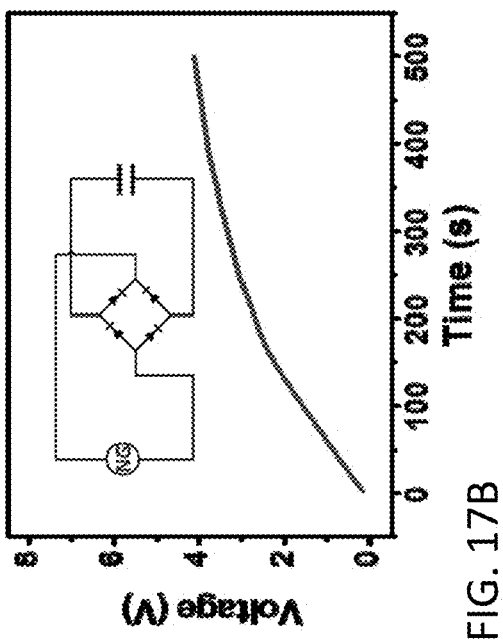

To investigate the output ability of the porous CMC/PDMS aerogel film-based compact NG, it was connected to resistors with different resistance values ($10^3$-$10^7$Ω). As shown in FIG. 17A, the output voltage through the external resistor increased gradually with increasing resistance, and it was expected that the output voltage would reach approximately 30 V at an infinitely high resistance. In contrast, the output power on the external load by the NG exhibited a peak value of about 0.05 mW at a resistance of 1 MΩ (FIG. 17A). To demonstrate a practical application of the porous CMC/PDMS aerogel film-based compact NG, the NG was used to power up eleven blue LEDs (with a turn-on voltage of about 2.6 V for each). The eleven blue LEDs were directly connected in series to a NG through a commercial bridge rectifier in the form of the letter "W." It should be noted that these LEDs were instantly turned on by the NG once it was subjected to an external stress. To further demonstrate the NG as an energy harvesting power source, it was used to charge a capacitor (22 μF) through a bridge rectifier. As shown in FIG. 17B, it charged the capacitor to ~4.0 V in 500 seconds. Moreover, the reliability of the porous CMC/PDMS aerogel film-based compact NG was tested by continuously applying and releasing an external stress 1200 cycles per day. As shown in FIG. 17C, the output voltages did not show an obvious change after three days, demonstrating that the NGs possessed superior stability and reliability.

Figures 18A, 18B:
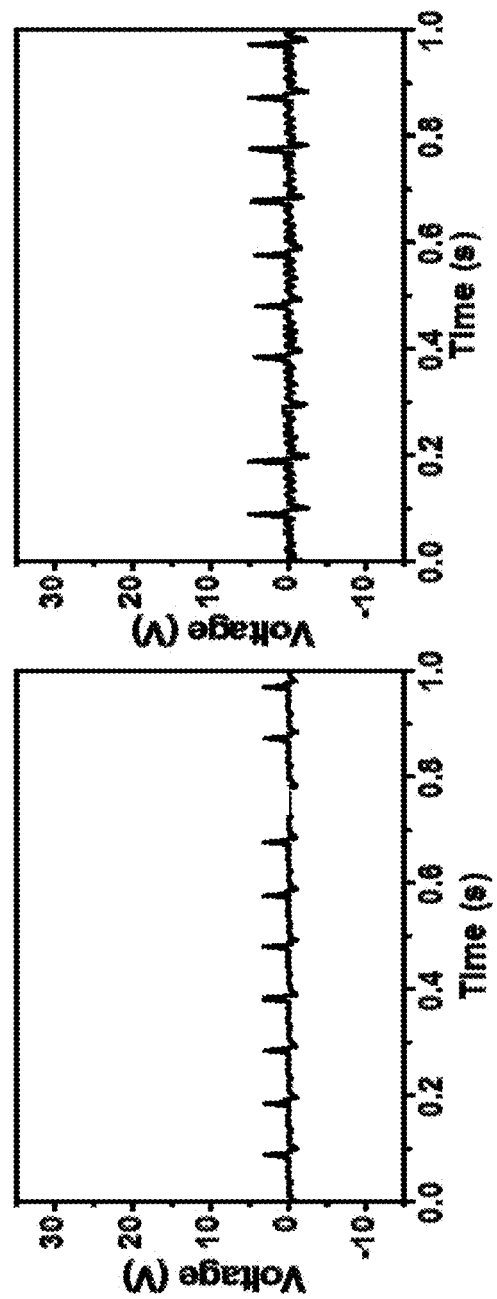
FIGS. 18A-18F depict a comparison of the electric output voltage generated by a compact NG.
Figure 18C:
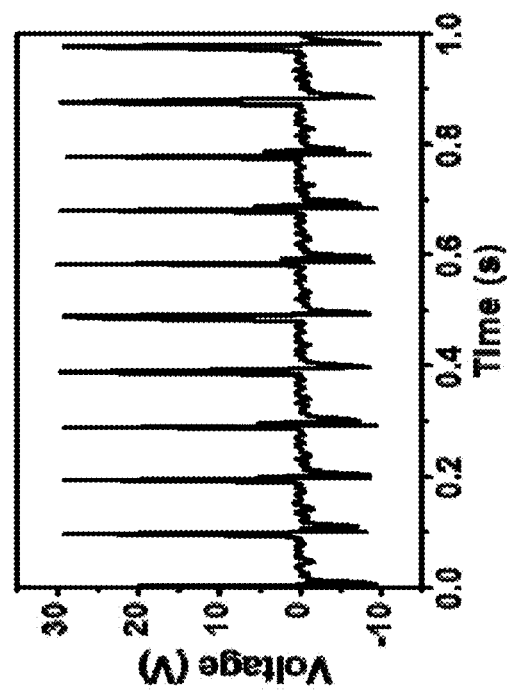
Figure 18D:
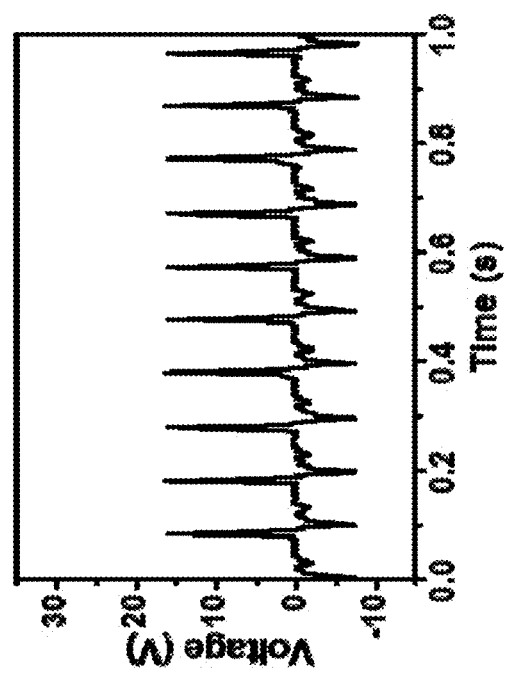

CMC is not a piezoelectric material, which was confirmed by the negligible output voltage induced by the NG made of a CMC aerogel film (FIG. 18A). FIG. 18B shows the output voltage generated from a NG fabricated using a pure/solid PDMS film with a $V_{oc}$ of 5.0 V. Those small electrical signals may be attributed to the electrostatic charges at the interface between the CMC aerogel film or the PDMS film and the aluminum electrodes. FIG. 18C shows the electric output voltage of the NG composed of a porous CMC/PDMS aerogel film with a $V_{oc}$ of 17 V, which was significantly higher than that of the NG made of the CMC aerogel film or pure PDMS film alone. Moreover, the output voltage of the NG was further increased to 30.0 V by spin-coating a PDMS layer on both sides of the CMC/PDMS aerogel film (FIG. 18D). The spin-coated PDMS layer on both sides of the porous CMC/PDMS aerogel film made the surfaces of the porous CMC/PDMS film smoother, which could provide high potential barriers, thereby preventing charge leakage and transfer the compressive stress more effectively to the porous CMC/PDMS aerogel film, thus leading to better output performance.

Figure 9:
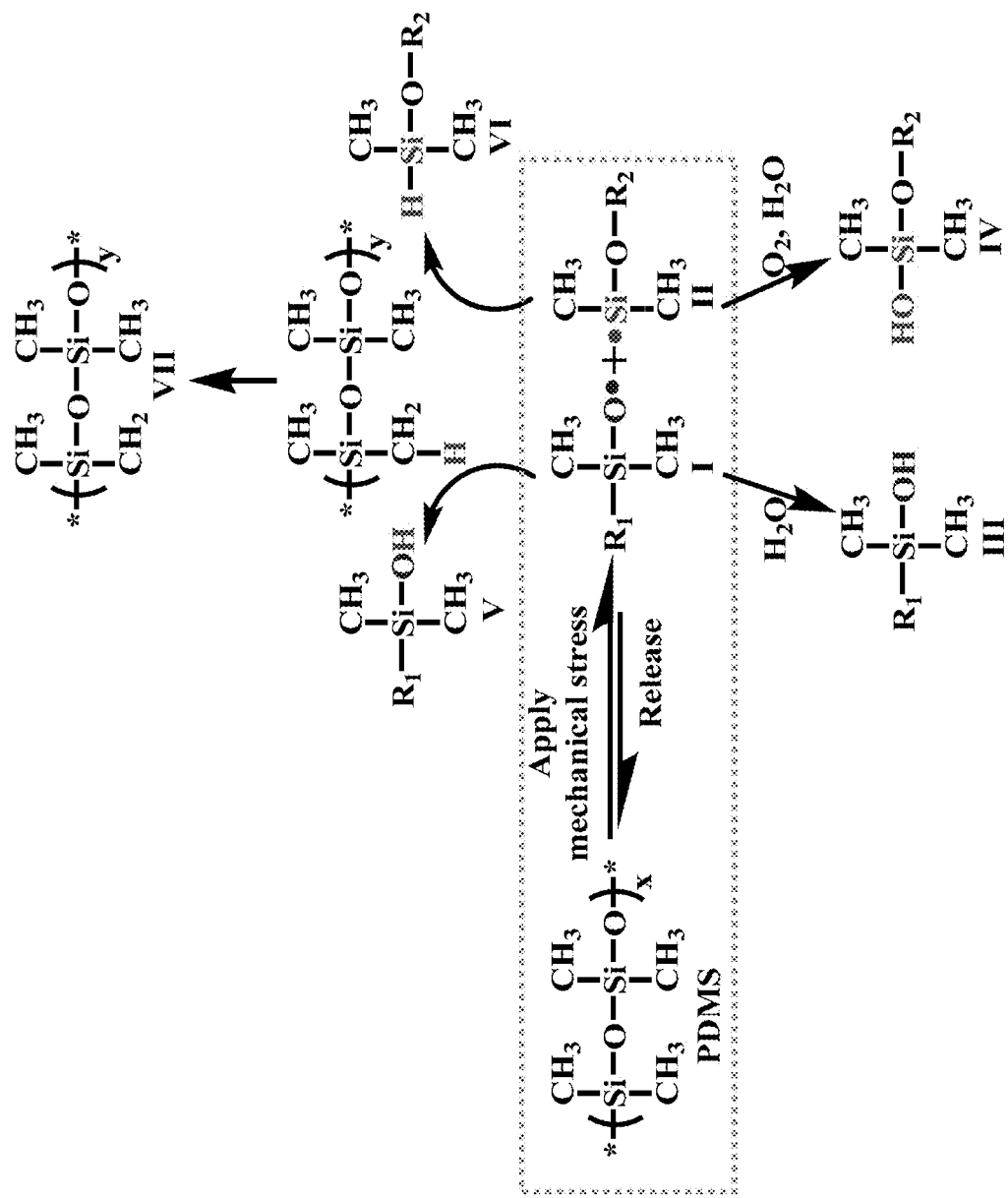
FIG. 9 is a schematic that illustrates the homolytic cleavage of PDMS upon the application of a mechanical stress.

A high-surface-area PDMS sponge can effectively generate mechanoradicals when subjected to an external stress. On the contrary, solid PDMS does not generate free radicals as effectively as a PDMS sponge under a similar mechanical stress. As illustrated in the scheme shown in FIG. 9, the mechanical stress can lead to a homolytic cleavage of the Si—O—Si covalent bond in the porous PDMS coating of the CMC aerogel, thus producing abundant Si—O. (I) and O—Si. (II) mechanoradicals, leading to the formation of a large amount of transient dipole moments. Such a dramatic electric dipole moment change before and after the cleavage of the Si—O—Si bonds under mechanical stress will create an electric potential between the top and bottom electrodes, inducing the accumulation of negative and positive charges at the top and bottom electrodes, thus driving current flow through an external circuit resulting in positive output signals (FIG. 9). The activation energies of the reactions between free radicals are near zero, thus most of these mechanoradicals will reversibly recombine to form the Si—O—Si bond. (See, B. Baytekin, et al., Energy & Environmental Science 6 (2013) 3467-3482; and J. J. Dannenberg, et al., J Am Chem Soc 107 (1985) 671-674.) A smaller fraction of the Si—O. and Si. radicals can react with trace water in the air to yield silanols (III and IV), or they can extract H from neighboring $CH_3$ groups to form silanols (V) or Si—H bonds (VI) while transferring the free radicals onto the carbon atoms (VII). (See, H. T. Baytekin, et al., Angewandte Chemie International Edition 51 (2012) 3596-3600; and B. Baytekin, et al., Energy & Environmental Science 6 (2013) 3467-3482.) These silanols not only exhibit permanent electric dipole moments by themselves, but can also form hydrogen bonding, leading to an increase in the density of electric dipoles and consequently enhancing the electric outputs.

Once the stress was released, the diminishment of the electric potential led to the back flow of the accumulated charges through the external circuit, leading to the negative electrical signals. In comparison to the relatively high compression rate, the porous aerogel film-based compact NGs took a longer time to return to their undistorted state, resulting in a slow diminishment of the electric potential. Thus, the positive electric signal was always higher than the negative one for the porous aerogel film-based compact NGs under forward connection. For comparison purposes, the output voltages of the compact NGs under reverse connection to the external circuit were also measured. As expected, the negative output signals under reverse connection were higher than the positive output signals. Furthermore, the $V_{oc}$ values under reverse connection were almost identical to those obtained under forward connection, albeit the polarities of the signals were reversed.

Figures 18E, 18F:
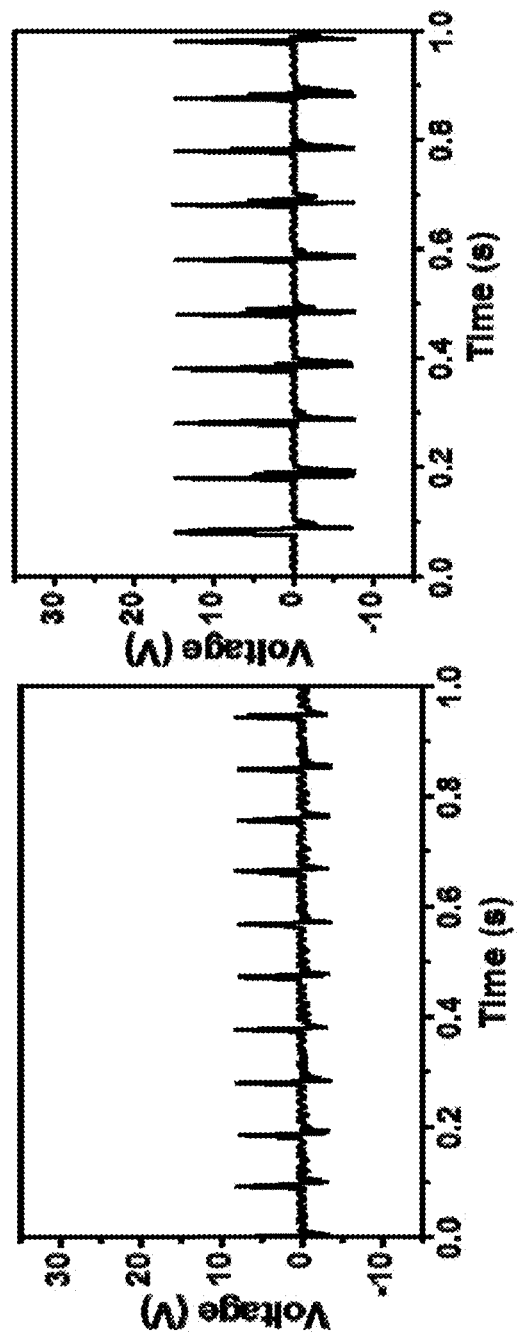

In order to demonstrate the importance of the highly porous structure of the CMC/PDMS aerogel film, the pores of the CMC aerogel film were filled as completely as possible with pure PDMS (8% porosity), and the $V_{oc}$ of the nearly completely filled CMC/PDMS film-based NG was only 8 V (FIG. 18E). Furthermore, porous CMC/PDMS aerogel films with a porosity of 19% were also prepared, and the resulting NGs exhibited a $V_{oc}$ of 15V (FIG. 18F). In contrast, as discussed previously, the $V_{oc}$ of the porous CMC/PDMS aerogel film (with a porosity of 40%) was around 30 V.

To further investigate this mechanoradical-based mechanism, the effects of different amounts of 2,2,6,6-tetramethyl-1-piperidinyloxy (TEMPO), a common free radical scavenger, mixed in the PDMS coating on the electric outputs of the porous CMC/PDMS aerogel film-based NGs were studied. The electric output voltages of the as-prepared porous CMC/PDMS (TEMPO) aerogel film-based NGs decreased obviously with an increasing amount of TEMPO. In particular, when the amount of TEMPO reached 20 wt %, the output voltage decreased to only about 4 V.

To further explore this mechanoradical-based mechanism, thermoplastic polyurethane (TPU), a typical polymer that does not efficiently generate free radicals under an external stress, was employed to replace PDMS to prepare porous CMC/TPU film-based NGs using a similar assembly. Theoretically, since CMC and TPU are not traditionally considered piezoelectric materials, and TPU does not effectively generate mechanoradicals, the porous CMC/TPU film-based NGs were not expected to produce significant electric outcomes. Indeed, only very weak electric signals were collected from NGs using either a pure TPU film or a porous CMC/TPU film, which may be attributed to the electrostatic charges at the interface under an external stress.

Figures 19A, 19B:
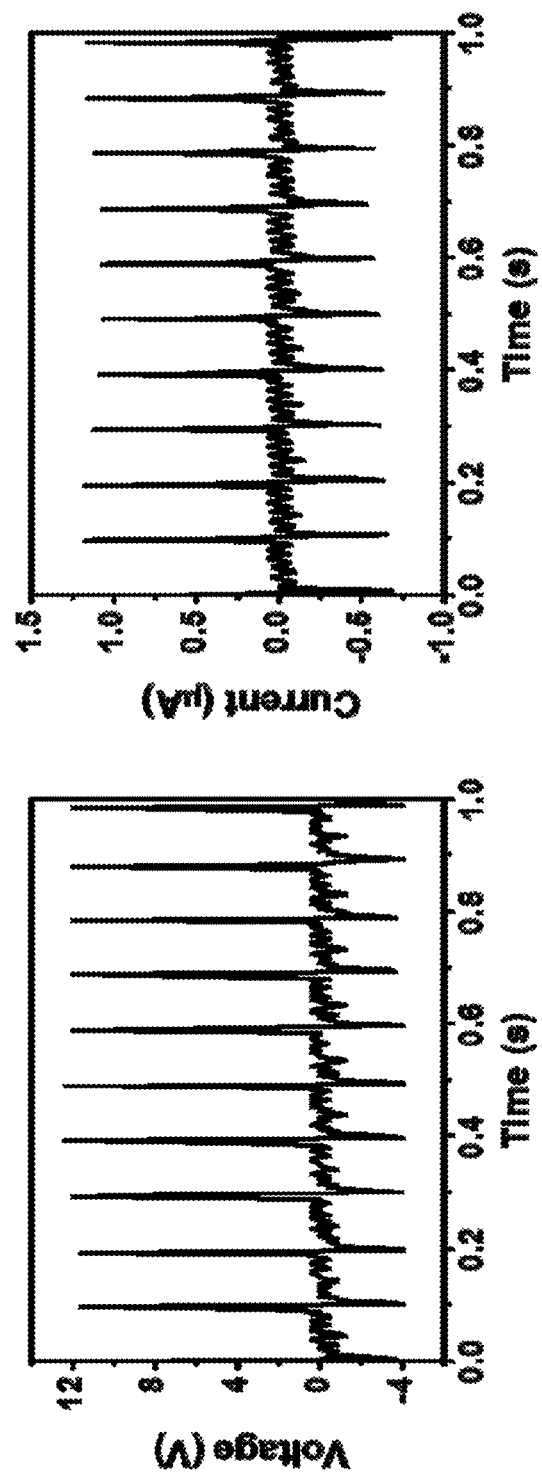
FIGS. 19A-19D show the electric output ($V_{oc}$ and $I_{sc}$) measurement of compact NGs fabricated employing PBA-PBMA to replace PDMS.
Figure 19D:
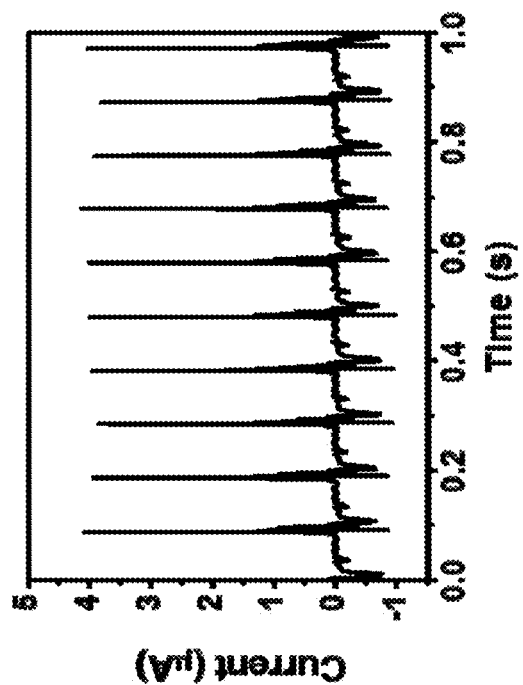
Figure 19C:
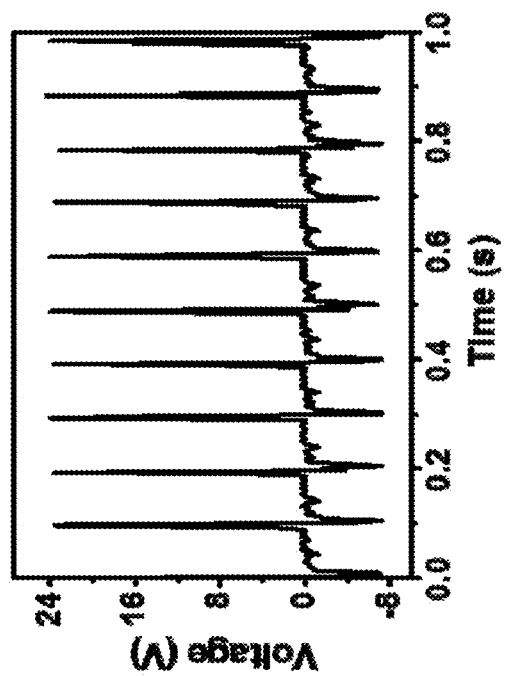

To further demonstrate the role of mechanoradicals in this type of compact triboelectric NG, the porous PDMS coating was replaced using yet another type of polymer coating: namely, a mixture of PBA and PBMA. Both PBA and PBMA are capable of efficiently generating mechanoradicals. However, the glass transition temperature of PBA was very low ($-55°$ C.); thus, the pure PBA film was somewhat sticky. On the other hand, the pure PBMA film was somewhat rigid. As a result, a PBA-PBMA blend at a 1:1 weight ratio was used as the porous CMC aerogel film coating to replace the PDMS coating for the electric NG. For comparison purposes, the NGs fabricated using only solid PBA-PBMA films were also prepared and characterized. As shown in FIGS. 19A and 19B, the output signals of $V_{oc}$ and $I_{sc}$ of the solid PBA-PBMA film-based NG were 12 V and 1.2 µA, respectively, which supports the conclusion that PBA and PBMA can effectively generate mechanoradicals. The $V_{oc}$ and $I_{sc}$ outputs of the porous CMC/PBA-PMBA aerogel film-based NG were 24 V and 4.0 µA, respectively (FIGS. 19C and 19D). These findings again confirm the importance of porosity on the generation of mechanoradicals and, consequently, the electric outputs.

Figure 20B:
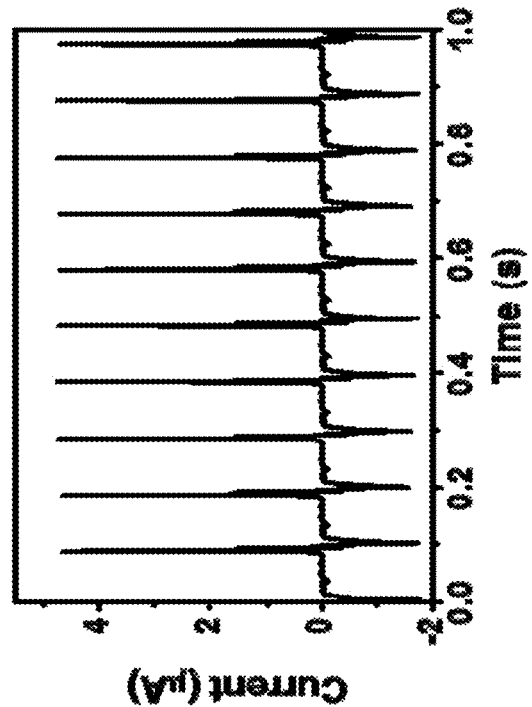
FIGS. 20A-20D depict the electric output ($V_{oc}$ and $I_{sc}$) measurement of compact NGs fabricated using CTS and PVA to replace CMC.
Figure 20A:
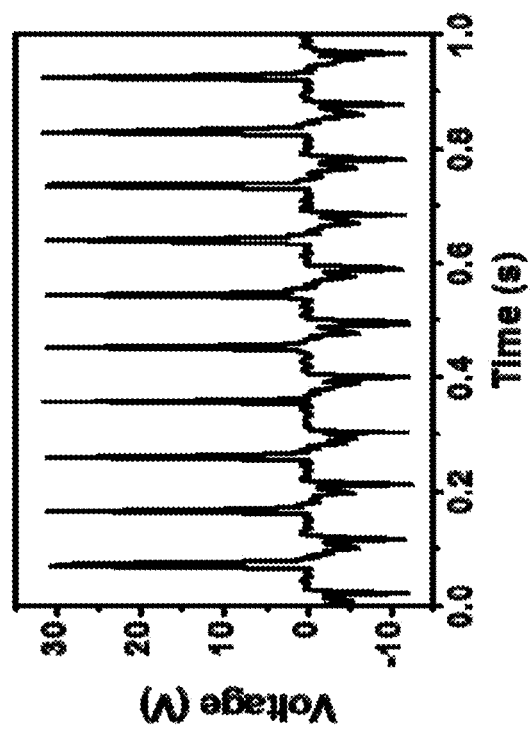
Figures 20C, 20D:
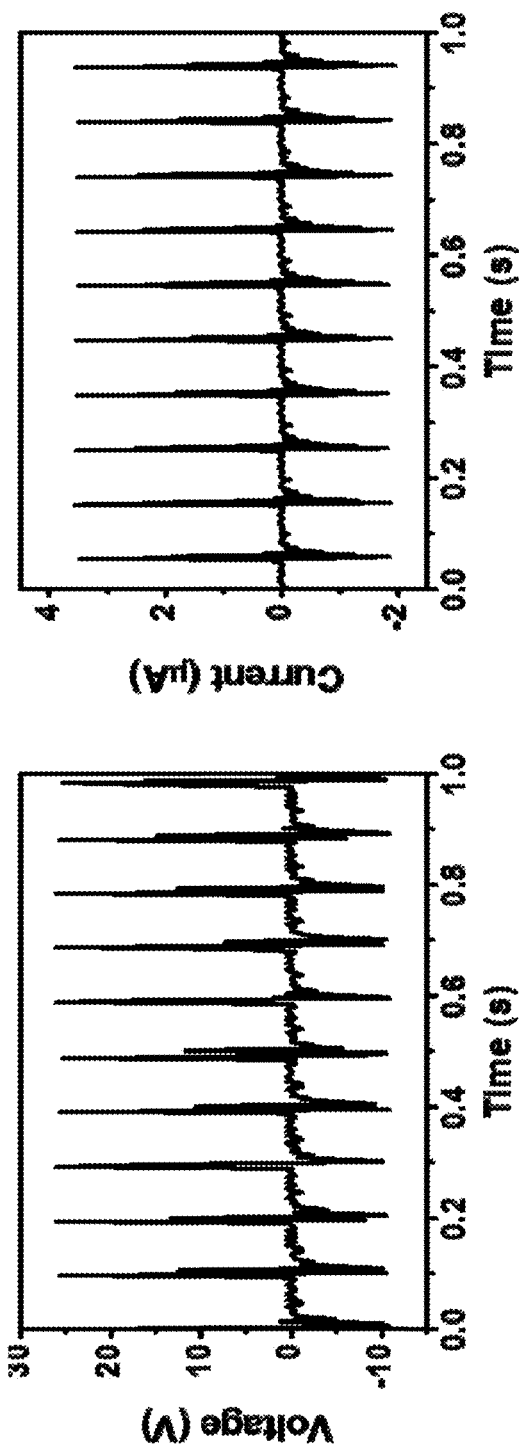

To demonstrate that the CMC aerogel scaffold may be replaced by other types of aerogel scaffolds for the formation of the porous PDMS film, two other types of aerogels—namely, CTS and PVA—were prepared and used as the scaffolds on which to coat the PDMS films. The resulting porous CTS/PDMS and PVA/PDMS aerogel films (porosities of 39% and 38%, respectively) were used to prepare compact NGs with a similar structure as the porous CMC/PDMS aerogel film-based compact NG shown in FIG. 14, panel (g). As demonstrated in FIG. 20, the porous CTS/PDMS aerogel film-based compact NG exhibited a $V_{oc}$ of 32 V and a $I_{sc}$ of 4.6 µA, while the porous PVA/PDMS aerogel film-based compact NG displayed a $V_{oc}$ of 26 V and a $I_{sc}$ of 3.6 µA. These results support the conclusion that a key role of the aerogel films was to provide a porous scaffold on which to form the porous mechanoradical-generating polymer coating (e.g., PDMS and PBA-PBMA blend), thereby enhancing their ability to generate mechanoradicals and consequently resulting in better electric outputs. Furthermore, these results demonstrate that coating a layer of mechanoradical-generating polymer onto the porous surface of the aerogel film can be a universal method for achieving high performance energy haversting materials.

Fabrication of Porous CMC/PBA-PMBA Aerogel Film-Based Compact NGs

A PBA-PBMA blend solution at a 1:1 weight ratio was prepared by dissolving PBMA (5.0 g) in toluene (10.0 mL), followed by adding a PBA toluene solution (15.0 g). The compressed CMC aerogel film was coated with the above PBA-PBMA solution using a vacuum-assisted liquid filling method. The well-coated aerogel film was left in a hood for 1 h followed by heating in an oven at 100° C. for another 1 h to vaporize the solvent. The CMC/PBA-PMBA aerogel sample was spin-coated on both sides with the PBA-PMBA solution followed by removing the solvent in a hood for 2 h and in an oven at 100° C. for 1 h. The resulting PBA-PMBA/(porous CMC/PBA-PMBA aerogel film)/PBA-PMBA sandwich-like tri-layer film was cut into pieces (1 cm×1.2 cm in area, 530 µm in thickness). Thereafter, aluminum foil was affixed to both sides of the tri-layer film sample to obtain the NG. For comparison, NG made of pure PBA-PMBA film (530 µm in thickness) was also prepared.

Fabrication of Porous CTS/PDMS Aerogel Film-Based Compact NGs

The CTS aqueous solution was prepared by dissolving CTS (0.200 g) in water (20 mL) with the addition of HCl (0.5 mL) in an aluminum pan. The CTS aerogel was obtained after a freeze-drying process as previously reported. (See, Q. Zheng, et al., Acs Appl Mater Inter 7 (2015) 3263-3271; Q. Zheng, et al., Journal of Materials Chemistry A 2 (2014) 3110-3118.) The CTS aerogel samples were compressed into aerogel films under a pressure of 0.20 MPa. A PDMS solution was prepared from a PDMS prepolymer, curing agent (Sygard 184, Dow Corning), and ethyl acetate at a ratio of 10:1:20. The compressed CTS aerogel was then dipped into the PDMS solution using a vacuum-assisted liquid filling method to enable the solution to penetrate into the inner pores. The well-coated aerogel film was left in a hood for 2 h to vaporize the solvent and then cured at 100° C. for 1 h. The CTS/PDMS aerogel film was spin-coated on both sides with a PDMS prepolymer and curing agent mixture (without any solvent) at a 10:1 ratio. The sample was cured again at 100° C. for 1 h. The resulting PDMS/(porous CTS/PDMS aerogel film)/PDMS sandwich-like tri-layer film was cut into pieces (1 cm×1.2 cm in area, 550 µm in thickness). Thereafter, aluminum foil was affixed to both sides of the tri-layer film sample to obtain the NG.

Fabrication of Porous PVA/PDMS Aerogel Film-Based Compact NGs

The PVA aqueous solution was prepared by dissolving PVA (0.200 g) in water (20 mL) at 80° C. The PVA aerogel was obtained after a freeze-drying process as previously reported. (See, Q. Zheng, et al., Acs Appl Mater Inter 7 (2015) 3263-3271; Q. Zheng, et al., Journal of Materials Chemistry A 2 (2014) 3110-3118.) The PVA aerogel samples were compressed into aerogel films under a pressure of 0.10 MPa. A PDMS solution was prepared from a PDMS prepolymer, curing agent (Sygard 184, Dow Corning), and ethyl acetate at a ratio of 10:1:20. Then the compressed PVA aerogel was dipped into the PDMS solution using a vacuum-assisted liquid filling method to enable the solution to penetrate into the inner pores. The well-coated aerogel film was left in a hood for 2 h to vaporize the solvent and then cured at 80° C. for 1 h. The PVA/PDMS aerogel film was spin-coated on both sides with a PDMS prepolymer and curing agent mixture (without any solvent) at a 10:1 ratio. The sample was cured again at 80° C. for 1 h. The resulting PDMS/(porous PVA/PDMS aerogel film)/PDMS sandwich-like tri-layer film was cut into pieces (1 cm×1.2 cm in area, 520 µm in thickness). Thereafter, aluminum foil was affixed to both sides of the tri-layer film sample to obtain the NG.

Calculation of Aerogel Porosity (See, Q. Zheng, et al., Journal of Materials Chemistry a 2 (2014) 3110-3118):

The densities of the solid materials ($\rho_s$) were calculated according to Equation 4 based on the solid density of each component and their weight ratios used in the formulation, $$\rho_s = \frac{1}{\frac{W_{PDMS}}{\rho_{PDMS}} + \frac{W_{CMC}}{\rho_{CMC}}} \quad (4)$$

where W was the weight percentage of the different components, and $\rho_{PDMS}$ and $\rho_{CMC}$ were the solid densities of PDMS and CMC, respectively.

The solid densities for PDMS, CMC, CTS, and PVA used here were 1000, 1600, 1750, and 1300 kg/m³, respectively, according to the manufacturer's data sheet. The porosities of the porous aerogel samples were calculated according to Equation S3, $$\text{Porosity} = \left(1 - \frac{\rho_a}{\rho_s}\right) \times 100\% \quad (5)$$

where $\rho_a$ was the measured density of each porous aerogel sample, and $\rho_s$ was the density of its corresponding solid sample.

TABLE 2

Parameters $\rho_a$, $\rho_s$, and porosities of the samples.

| Samples | $\rho_a$ (kg/m³) | $\rho_s$ (kg/m³) | Porosity (%) |
|---|---|---|---|
| CMC aerogel | 13.5 | 1600 | 99 |
| Compressed CMC aerogel film | 166 | 1600 | 90 |
| Porous CMC/PDMS aerogel film-1 | 671 | 1124 | 40 |
| Porous CMC/PDMS aerogel film-2 | 890 | 1100 | 19 |
| Nearly solid CMC/PDMS film | 970 | 1052 | 8 |
| CTS aerogel | 16.8 | 1750 | 99 |
| Compressed CTS aerogel film | 168 | 1750 | 90 |
| Porous CTS/PDMS aerogel film | 665 | 1098 | 39 |
| PVA aerogel | 16.4 | 1300 | 95 |
| Compressed PVA aerogel film | 157 | 1300 | 88 |
| Porous PVA/PDMS aerogel film | 668 | 1072 | 38 |

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. An electric generator comprising:
a first deformable electrode;
a second deformable electrode in electrical communication with the first deformable electrode; and
a deformable porous layer of electric generation material disposed between the first deformable electrode and the second deformable electrode, wherein the electric generation material comprises a porous support and a polymer coating on the surfaces of the porous support, including the surfaces of the pore walls, the polymer coating comprising an organic polymer that forms mechanoradicals upon the application of a compressive force.

2. The generator of claim 1, wherein the porous support is an aerogel.

3. The generator of claim 2, wherein the porous support comprises an intrinsically piezoelectric material.

4. The generator of claim 1, wherein the porous support comprises an intrinsically piezoelectric material.

5. The generator of claim 1, wherein the porous support comprises cellulose.

6. The generator of claim 5, wherein the cellulose is a piezoelectric form of cellulose.

7. The generator of claim 1, wherein the porous support comprises a polysaccharide.

8. The generator of claim 7, wherein the polysaccharide is a chitin or a chitosan.

9. The generator of claim 1, wherein the porous support comprises a second organic polymer that is different from the organic polymer that forms mechanoradicals upon the application of a compressive force.

10. The generator of claim 9, wherein the second organic polymer is poly(vinyl alcohol).

11. The generator of claim 1, wherein the porous support comprises an inorganic material.

12. The generator of claim 1, wherein the organic polymer that forms mechanoradicals upon the application of a compressive force is polydimethylsiloxane.

13. The generator of claim 1, wherein the organic polymer that forms mechanoradicals upon the application of a compressive force is poly(n-butyl acrylate), poly(n-butyl methacrylate), or a blend of poly(n-butyl acrylate) and poly(n-butyl methacrylate).

14. The generator of claim 1, wherein the organic polymer that forms mechanoradicals upon the application of a compressive force is poly(vinyl chloride), polytetrafluoroethylene, polyoxymethylene, or polystyrene.

15. The generator of claim 1, wherein the porous layer of electric generation material has a porosity of at least 20%.

16. An energy harvesting system comprising:
an electric generator comprising:
a first deformable electrode;
a second deformable electrode in electrical communication with the first deformable electrode; and
a deformable porous layer of electric generation material disposed between the first deformable electrode and the second deformable electrode, wherein the electric generation material comprises a porous support and a polymer coating on the surfaces of the porous support, including the surfaces of the pore walls, the polymer coating comprising an organic polymer that forms mechanoradicals upon the application of a compressive force; and
an electronic device, wherein the electric generator and the electronic device are configured such that the electronic device is powered by electrical energy generated by the generator when the generator is subjected to a periodic external compressive force.

17. An electric generator comprising:
a first deformable electrode;
a second deformable electrode in electrical communication with the first deformable electrode; and
a deformable porous layer of electric generation material disposed between the first deformable electrode and the second deformable electrode, wherein the electric generation material comprises a porous polymer matrix of an organic polymer that forms mechanoradicals upon the application of a compressive force.

18. The generator of claim 17, wherein the organic polymer that forms mechanoradicals upon the application of a compressive force is polydimethylsiloxane.

19. The generator of claim 17, wherein the organic polymer that forms mechanoradicals upon the application of a compressive force is poly(n-butyl acrylate), poly(n-butyl methacrylate), or a blend of poly(n-butyl acrylate) and poly(n-butyl methacrylate).

20. The generator of claim 17, wherein the organic polymer that forms mechanoradicals upon the application of a compressive force is poly(vinyl chloride), polytetrafluoroethylene, polyoxymethylene, or polystyrene.

21. A energy harvesting system comprising
an electric generator comprising:
a first deformable electrode;
a second deformable electrode in electrical communication with the first deformable electrode; and
a deformable porous layer of electric generation material disposed between the first deformable electrode and the second deformable electrode, wherein the electric generation material comprises a porous polymer matrix of an organic polymer that forms mechanoradicals upon the application of a compressive force; and
an electronic device, wherein the electric generator and the electronic device are configured such that the electronic device is powered by electrical energy generated by the generator when the generator is subjected to a periodic external compressive force.

* * * * *

UNITED STATES PATENT AND TRADEMARK OFFICE
CERTIFICATE OF CORRECTION

PATENT NO. : 10,629,800 B2
APPLICATION NO. : 15/648796
DATED : April 21, 2020
INVENTOR(S) : Shaoqin Gong et al.

Page 1 of 1

It is certified that error appears in the above-identified patent and that said Letters Patent is hereby corrected as shown below:

In the Specification

Column 15, Line 33:
Delete the phrase "generating numerous ≡SiO. and ≡Si." and replace with --generating numerous ≡SiO• and ≡Si•--.

Column 15, Line 43:
Delete the phrase "abundant Si–O. (I) and O-Si. (II)" and replace with --abundant Si–O• (I) and O–Si• (II)--.

Column 16, Line 32:
Delete the phrase "a capacitor (22 µf)" and replace with --a capacitor (22 µF)--.

Signed and Sealed this
Eleventh Day of August, 2020

Andrei Iancu
*Director of the United States Patent and Trademark Office*